(12) United States Patent
Pedersen et al.

(10) Patent No.: US 7,583,137 B2
(45) Date of Patent: Sep. 1, 2009

(54) POWER SUPPLY COMPENSATION

(75) Inventors: Kim Rishøj Pedersen, Egå (DK); Lars Arknæs-Pedersen, Viby J (DK)

(73) Assignee: The TC Group A/S (DK)

( * ) Notice: Subject to any disclaimer, the term of this patent is extended or adjusted under 35 U.S.C. 154(b) by 133 days.

(21) Appl. No.: 10/575,495

(22) PCT Filed: Oct. 11, 2004

(86) PCT No.: PCT/DK2004/000696

§ 371 (c)(1),
(2), (4) Date: May 16, 2007

(87) PCT Pub. No.: WO2005/036735

PCT Pub. Date: Apr. 21, 2005

(65) Prior Publication Data

US 2007/0200626 A1    Aug. 30, 2007

(30) Foreign Application Priority Data

Oct. 10, 2003   (WO) .................... PCT/DK03/00688

(51) Int. Cl.
    *H03F 3/38* (2006.01)
(52) U.S. Cl. .................... 330/10; 330/129; 330/297
(58) Field of Classification Search ................ 330/10, 330/127, 129, 137, 297, 172
See application file for complete search history.

(56) References Cited

U.S. PATENT DOCUMENTS

| | | | |
|---|---|---|---|
| 6,297,692 B1 | 10/2001 | Nielsen | 330/10 |
| 6,344,811 B1 | 2/2002 | Melanson | 330/143 |
| 6,518,838 B1 | 2/2003 | Risbo | 330/10 |
| 6,741,123 B1 * | 5/2004 | Andersen et al. | 330/10 |
| 7,332,959 B2 * | 2/2008 | Christian | 330/10 |
| 2002/0180518 A1 | 12/2002 | Midya et al. | 330/10 |

FOREIGN PATENT DOCUMENTS

EP   0 503 571   9/1992

OTHER PUBLICATIONS

International Search Report; PCT/DK2004/000696; Feb. 3, 2005.

* cited by examiner

*Primary Examiner*—Khanh V Nguyen
(74) *Attorney, Agent, or Firm*—Cantor Colburn LLP

(57) ABSTRACT

The invention relates to an amplifier comprising amplification means (AM) comprising an input and an output,
said amplification means (AM) comprising a switching output stage delivering at least one output signal (OUS) via said output,
said amplification means being fed by power supply means (PSM)
said amplifier further comprising compensation means (CM) providing a compensation signal (CS) derived from the power supply voltage (PSV) of the power supply means (PSM), said compensation signal (CS) comprising a substantially inverse representation of said power supply voltage (PSV) and
said compensation signal (CS) being fed to said amplification means (AM).

According to the invention, an effective error compensation of the output switching stage may in practice be implemented by establishment of a compensation, which on a run-time basis is based on the voltage of the power supply currently applied in the output switching stage.

58 Claims, 18 Drawing Sheets

US 7,583,137 B2

POWER SUPPLY COMPENSATION

CROSS-REFFERENCE TO RELATED APPLICATION

This application is related to and claims the benefit of International Patent Application No. PCT/DK2003/00688 filed on 10 Oct. 2003 designating the United States of America, said application being incorporated herein by reference in its entirety.

FIELD OF THE INVENTION

The present invention relates to power supply compensation.

BACKGROUND OF THE INVENTION

The invention addresses different problems related to the use of switching amplifiers. Switching amplifiers have been known for several years and have over the last years gradually been introduced into different technical fields, such as motor control, audio-applications, etc.

An advantage of switching amplifiers is among many that a power output may be obtained more or less directly on the basis of the available power supply, thereby reducing the requirement of high-power transformers, etc.

One problem of such amplifiers is, however, that a relatively unstable power supply may have a significant influence on the resulting amplified signal.

One of the objects of the invention is to reduce problems resulting from errors on the switching stage of an amplifier.

SUMMARY OF THE INVENTION

The present invention relates to an amplifier comprising amplification means AM comprising an input and an output, said amplification means AM comprising a switching output stage delivering at least one output signal OUS via said output, said amplification means being fed by power supply means PSM said amplifier further comprising compensation means CM providing a compensation signal CS derived from the power supply voltage PSV of the power supply means PSM, said compensation signal CS comprising a substantially inverse representation of said power supply voltage PSV and said compensation signal CS being fed to said amplification means AM.

According to the invention, an effective error compensation of the output switching stage may in practice be implemented by establishment of a compensation, which on a run-time basis, is based on the voltage of the power supply currently applied in the output switching stage.

Another way of describing the invention is basically, that an error signal, the compensation signal, is fed to the amplification means by incorporating the compensation signal into the input signal which is to be amplified, in order to counteract expected errors in the amplifier stage.

The inverse representation of the power supply voltage PSV refer in the present application to a compensation signal which when added or multiplied to the input signal of an amplifier results in an amplified signal as if variations in the power supply voltage was at least partially counteracted. In other words, variations in the power supply voltage are at least partially counteracted by modification of the input signal.

Thus the signal to be amplified is compensated by modification of the signal itself, instead of controlling the amplifier and/or power supply, i.e. the signal adapts to the current state of the power supply and amplifier. Thereby applications incorporating the present invention may offer high quality amplification without depending on sophisticated, inflexible and expensive power supplies.

The amplifier according to the invention may be regarded as an amplifier system thereby facilitating a degree of distribution of the components of the amplifier.

According to an embodiment of the invention, an input may comprise a single stream of digital signal to be distributed on an input comprising several different channels. Examples of relevant encoding schemes and inputs of such are, e.g., S/PDIF, TOSLINK, ADAT, Dolby Digital, DTS Digital Surround, DTS-ES Discrete 6.1, etc., offering stereo, 5.1 surround, 6.1 surround or even 7.1 surround multi-channel sound distribution by a single physical input.

According to another embodiment of the invention, a digital input signal may be delivered on the input as a parallel stream of input signals. The digital input signals may then be distributed to corresponding channels on the output of the amplifier or combined according to algorithms defined in the signals or in the amplifier.

It is noted that a multi-channel approach according to the invention is regarded to be highly attractive as different switching stages, e.g. corresponding to two or several output signals, may share the establishing of the compensation signal. Thus, a bundle of switching output amplifiers may be compensated equally or at least on the basis of only one compensation signal; the compensation signal may both be established on the basis of a measurement directly on the power supply means or on the basis of a measurement on the output stage. In the latter, only a measurement on one of the output switching amplifiers would suffice, depending on the required or desired precision and equivalence of design.

In this context it should be noted that such a measurement should typically be performed on a run-time basis or at least enough to keep the amplifier compensated during use. Moreover, common use of the compensation signal throughout an amplifier system only works for components being supplied by a common power supply means, i.e. an individual compensation means should preferably be provided for each individual power supply means which provides a power signal used in a multiplicative relationship with a utility signal.

According to the invention, an inverse representation generally corresponds to what is somewhere referred to as the multiplicative inverse or the reciprocal.

It should moreover be noted that the established inverse representation may be realised in many different ways. According to a preferred embodiment of the invention such a compensation should be performed by a multiplication only. This may e.g. be done by establishing a path from the analog output stage, preferably directly from the power supply connection of the analog output stage, to the utility signal preprocessing path, and providing a feedback path in the opposite direction including a variable amplifier.

Two other examples, although both requiring somewhat more heavy signal processing, are disclosed in U.S. Pat. No. 5,559,467 and U.S. Pat. No. 6,344,811, both incorporated by reference with respect to the option of feeding a representation of an output stage back into the digital domain of a PWM modulator for the purpose of a compensating digitally for variation in the PWM output switch.

According to embodiments of the present invention, the compensation signal may be fed to the amplification means at different stages, and in different ways. Possibilities e.g. comprise multiplying the compensation signal to the input utility signal prior to any processing, subsequent to an upsampling process, subsequent to a quantizing and/or noise-shaping process, etc. Further possibilities e.g. comprise converting the compensation signal to an analog signal in order to modify an analog input signal, resample and/or modulate the compensation signal in order to adapt it to a particular encoding or modulation scheme, etc. Further possibilities e.g. comprise adapting the amplification means in order to facilitate feeding the compensation signal directly into the amplification means, and further adapting the amplification means with means for applying the compensation signal to the input signal.

In a preferred embodiment of the present invention said substantially inverse representation of the power supply voltage PSV is scaled by a ratio substantially corresponding to a desired amplification between the output and the input of the amplification means AM.

According to a preferred embodiment of the invention, the applied compensation signal should preferably correspond to an input signal, which when fed through the amplifier fully compensates for the undesired error on the output stage. When the compensation signal basically represents a desired voltage DV multiplied by the reciprocal of the power supply voltage PSV, an absolute gain regulation of the PWM signal has been obtained. It is thus possible to utilize the present invention for power regulation purposes as well as power supply compensation, as long as the input signal dynamics provides the additional overhead necessary in order to multiply the input signal with a compensation signal preferably greater than 1.0.

In a preferred embodiment of the present invention said compensation signal is established for maintaining a substantially fixed utility area of a period of the amplified pulse width modulated signal regardless of changes in the power supply voltage PSV.

According to the invention, a preferred compensation may be obtained by ensuring that the areas of PWM pulses of the output of the amplification switching stage that represents equal input values, are maintained equal, regardless of changes in the power supply voltage, by ensuring that an error such as a reduced amplitude on the output signal, i.e. the amplitude domain e.g. caused by an erroneous power supply voltage, is compensated for by an increased duty cycle (i.e. in the time domain). In other words, a reduced power may be compensated for, i.e. increased, by variation of the duty cycles of the applied signal.

In a preferred embodiment of the present invention said compensation means further comprises extrapolation means EM adapted for modifying said compensation signal CS according to a predefined extrapolation algorithm.

Predefined extrapolation means may according to the invention be established in many ways. However, according to a preferred embodiment of the invention such extrapolation, if necessary, should preferably ensure that an effective compensation is obtained at any time. Therefore, the inherent delay in the establishment of a compensation signal may be somewhat counteracted by applying a prediction, an extrapolation, of the expected variations in the power supply. This may be done due to the fact that the typical variations in the power supply very often are periodical or periodically to a certain degree and relatively slow varying.

In a preferred embodiment of the present invention said compensation signal CS is established on the basis of an inverting generator CM fed by a power supply comprising a circuit adapted for establishing an inverse signal of the voltage of said power supply.

According to a preferred embodiment of the invention, an inverting generator is applied for direct and fast establishment of a compensation signal. This may be compared to a running measuring of the level of the output stage and a subsequent running calculation based on time-consuming division.

In a preferred embodiment of the present invention said inverting generator comprises at least one feedback loop having a power supply voltage dependent feedback.

In a preferred embodiment of the present invention said inverting generator comprises
- at least one forward path LF, MM, QM having an input and an output,
- at least one reference oscillator SG
- at least one feedback path derived from said forward path and fed back to said input of said forward path by means of a summing point SP subtracting the feed-back signal from an input received from said reference oscillator SG wherein said feedback path comprises a power supply voltage dependent feedback In a preferred embodiment of the present invention said inverting generator outputs a digital signal on the output PWCS of said forward path derived from at least one analog signal received in said input PSVR.

In a preferred embodiment of the present invention said forward path comprises a limiter MM adapted for providing a pulse width modulated output signal PWCS of said forward path.

In a preferred embodiment of the present invention said forward path further comprises a time quantizer QM converting said pulse width modulated signal, preferably two level, into a time discrete signal fed to the output PWCS of said forward path.

In a preferred embodiment of the present invention said compensation signal is fed to said amplification means via at least one multiplication point MP in which the compensation signal is multiplied with a preferably digital input signal IUS.

In a preferred embodiment of the present invention said compensation means further comprises decimation means DM adapted for transforming said compensation signal CS into compatibility with said input signal IUS.

According to a preferred embodiment of the present invention, the output of the compensation means is preferably a PWM signal PWCS having a sample rate of e.g. 200 MHz. In order to be able to multiply this compensation signal with the input utility signal, which preferably is a high-resolution PCM signal with a sample rate of e.g. 48 kHz, it is necessary to transform the compensation signal. This may be performed by means of a decimation means DM, which may be any kind of suitable decimation means, rate converters, down-samplers, etc. Preferably the decimation means performs anti-aliasing.

In a preferred embodiment of the present invention the signal processing performed by said amplification means multiplicatively depend on the power supply voltage.

According to a preferred embodiment of the invention, the amplification means processes, e.g. amplifies, the input signal in a way multiplicatively dependent on the power supply voltage. Thus the power supply is substantially multiplied to the input signal rather than having its changes added to the input signal. Multiplicatively power supply voltage dependent amplification means may e.g. comprise PWM amplifiers, class D amplifiers, filters comprising limiters, etc.

When said inverting generator CM comprises at least one self-oscillating loop, an advantageous embodiment of the present invention is obtained.

By implementing the compensation means as a self-oscillator, several advantages may be obtained, e.g. more effective quantization noise suppression by higher loop gain and yet maintaining synchronization of the switch frequency with the input utility signal rate or PWM switch rate used in the amplifier.

When said self-oscillating loop comprises said at least one forward path LF, MM, QM and said at least one feedback path, an advantageous embodiment of the present invention is obtained.

When said forward path comprises at least one loop filter LF, an advantageous embodiment of the present invention is obtained.

When said at least one loop filter LF is adapted to facilitate self-oscillation, an advantageous embodiment of the present invention is obtained.

When the switch frequency of said pulse width modulated output signal PWCS provided by said limiter MM is at least partly defined by said at least one self-oscillating loop, an advantageous embodiment of the present invention is obtained.

The switch frequency, and thereby the rate of the PWM output signal, may be at least partly controlled by self-oscillating loop, in particular by the loop filter and characteristics of the limiter, but may however under certain circumstances in some embodiments fluctuate a little.

When the order of said at least one loop filter LF is at least one, an advantageous embodiment of the present invention is obtained.

When the order of said at least one loop filter LF is at least two, an advantageous embodiment of the present invention is obtained.

When the effective order of said transfer function is at least one, preferably substantially two, an advantageous embodiment of the present invention is obtained.

The closer the effective order of the loop filter is to two, the higher is the loop gain and thereby the noise and error suppression. This however also affects the phase margin, which should not be allowed to reach 0° at frequencies lower than the desired switch frequency. By effective order is referred to the slope of the amplitude characteristic for frequencies below the switch frequency.

When the phase margin UPM of the open loop characteristic of said self-oscillating loop for frequencies within a frequency band starting from the upper limit of the utility band and ending at the switch frequency is between 0° and 60°, more preferably between 0° and 45°, and even more preferably between 0° and 30°, an advantageous embodiment of the present invention is obtained.

The closer the phase margin is to 0°, i.e. the closer the overall phase shift is to −180°, the higher is the loop gain and thereby the noise and error suppression. This however also affects the phase margin, which should not be allowed to reach 0° at frequencies lower than the desired switch frequency.

When said inverting generator CM comprises switch frequency control means, an advantageous embodiment of the present invention is obtained.

By being able to control the switch frequency more precisely than obtainable by the loop filter itself, a better synchronization with the utility signal amplification means may be obtained.

When said switch frequency control means comprises an oscillating overlay signal generator connected to said at least one self-oscillating loop, an advantageous embodiment of the present invention is obtained.

When said reference oscillator SG provides a composite reference signal RS comprising a DC reference value and an oscillating overlay signal, an advantageous embodiment of the present invention is obtained.

When said oscillating overlay signal comprises a peak-to-peak amplitude of less than 10% of said DC reference value, preferably less than 5% of said DC reference value, an advantageous embodiment of the present invention is obtained.

When the clock frequency of said time quantizer QM is at least ten times greater than said switch frequency, preferably at least hundred times greater, an advantageous embodiment of the present invention is obtained.

The clock frequency of the quantizer relative to the switch frequency denotes the time precision by which the PWM output signal is sampled for digital processing and utilization. Fixation of the frequency is a trade-off between higher precision and less subsequent digital workload.

When said decimation means DM comprises an anti-aliasing filter having an impulse response which is longer than the period of said pulse width modulated output signal PWCS, preferably at least the length of two times the period of said pulse width modulated output signal PWCS, and even more preferably at least the length of three times the period of said pulse width modulated output signal PWCS, an advantageous embodiment of the present invention is obtained.

As soon as the impulse response of the anti-aliasing filter extends beyond the length of the PWM period, the filter efficiency is well improved. A preferred filter for use with the present invention comprises an impulse response length of three times the length of a PWM period.

When the stopband attenuation of said anti-aliasing filter of said decimation means DM is greater than 50 dB, preferably greater than 70 dB, an advantageous embodiment of the present invention is obtained.

When said anti-aliasing filter of said decimation means DM comprises stopbands defined by:

$$\text{Stopband} = k \cdot f_{Sout} \pm BW,$$

where k=1, 2, 3, . . . until the Nyquist frequency is reached, $f_{Sout}$ is the output rate of the decimation means DM and BW is the utility bandwidth, e.g. 20 kHz, an advantageous embodiment of the present invention is obtained.

When said anti-aliasing filter of said decimation means DM comprises at least two, preferably three, cascaded running average FIR filters, an advantageous embodiment of the present invention is obtained.

When said anti-aliasing filter of said decimation means DM further comprises two half-band FIR filters, an advantageous embodiment of the present invention is obtained.

When said power supply voltage dependent feedback comprises buffering means BM, an advantageous embodiment of the present invention is obtained.

When said buffering means BM comprises certain specifications substantially representing corresponding specifications of said amplification means AM, an advantageous embodiment of the present invention is obtained.

When said inverting generator is adapted for establishing at least one reciprocated electrical signal PWCS, said inverting generator comprising at least one feedback loop, said at least one feedback loop comprising
- at least one forward path being fed by a reference signal RS and comprising at least one non-linearity MM, and
- at least one feedback path comprising at least one variable amplifier BM,
- wherein at least one of said at least one variable amplifier is controlled on the basis of an electrical signal PSVR, an advantageous embodiment of the present invention is obtained.

According to an embodiment of the invention an advantageous way of obtaining a reciprocate of an electrical signal is obtained. An example of such electrical signal may e.g. comprise a voltage, e.g. of a voltage power source, or any other suitably electrically represented signal.

According to a preferred embodiment of the invention, two separate signals may be fed to a feedback loop comprising at least one non-linearity in the forward path combined with a variable amplifier arranged in the feedback loop. One of the signals, e.g. the signal intended to be the divisor-representation of the intended operation may feed, and thereby control at least one variable amplifier in the feed-back loop, while the dividend may be established by a preferably stable signal source, preferably a square wave or other periodic signal generator.

In other words, an embodiment of the present invention may be used for establishing the result of (k/x), where the electrical signal controlling the variable amplifier corresponds to x, and the reference signal corresponds to k. Thus a variable divider is established.

When at least one of said at least one feedback loop of said inverting generator comprises at least one quantization means QM, an advantageous embodiment of the present invention is obtained.

When at least one of said at least one feedback loop of said inverting generator comprises at least one digital-to-analog conversion means DAC, an advantageous embodiment of the present invention is obtained.

When at least one of said at least one feedback loop of said inverting generator comprises at least one loop filter LF, an advantageous embodiment of the present invention is obtained.

According to a preferred embodiment of the invention, noise, in particular quantization noise introduced by the quantization means, may be rejected and/or shaped, e.g. pushed to high frequencies, by means of one or more suitable loop filters.

When at least one of said at least one forward path of said inverting generator comprises at least one analog-to-digital converter QM, preferably comprising at least one latch, and at least one of said at least one feedback path of said inverting generator comprises at least one digital-to-analog converter DAC, an advantageous embodiment of the present invention is obtained.

The analog-to-digital converter (A/D converter) is adapted for converting at least one output of said non-linearity into a digital signal. The at least one digital-to-analog converter (D/A converter) is adapted for converting the output of said A/D converter into at least one analog signal.

When said input receives at least one input signal IUS, IUS1, IUS2, . . . IUS6, an advantageous embodiment of the present invention is obtained.

When said input receives a composite signal, said composite signal comprises at least two input signals IUS1, ISU2, . . . IUS6, an advantageous embodiment of the present invention is obtained.

When said composite signal comprises two input signals, i.e. a stereo signal, six signals, i.e. a 5.1 surround sound signal, or eight signals, i.e. a 7.1 surround sound signal, an advantageous embodiment of the present invention is obtained.

When said amplification means AM comprises at least one channel amplification means AM1, AM2, . . . AM6, an advantageous embodiment of the present invention is obtained.

When said amplification means AM comprises two, five, six, seven or eight channel amplification means AM1, AM2, . . . AM6, an advantageous embodiment of the present invention is obtained.

Popular multi-channel encoding schemes comprise stereo (2 channels), 5.1 surround sound (6 channels) and 7.1 surround sound (8 channels). As it may be desirable in a particular application to provide a separate or different amplification means for the low-frequency channel, i.e. the subwoofer channel, also 5 or 7 channels amplification means may be particularly useful. It is noted that any number of channel amplification means and any kind of single- or multi-channel encoding and distribution schemes are within the scope of the present invention.

When said amplification means AM delivers one output signal, two output signals, five output signals, six output signals, or eight output signals OUS, OUS1, OUS2, . . . OUS6 via said output, an advantageous embodiment of the present invention is obtained.

Popular output rendering setups, i.e. typically loudspeaker setups, comprise stereo (2 channels), 5.1 surround sound (6 channels) and 7.1 surround sound (8 channels). As it may be desirable in a particular application to provide a separate or different amplification means for the low-frequency channel, i.e. the subwoofer channel, also 5 or 7 output channels from the amplification means may be particularly useful. It is noted that any number of output signals and any kind of single- or multi-channel encoding and distribution schemes are within the scope of the present invention.

When said compensation signal CS is fed to at least one of said at least one channel amplification means AM1, . . . AM6 by multiplication with the corresponding said at least one input signal IUS, IUS1, . . . IUS6, an advantageous embodiment of the present invention is obtained.

When said extrapolation means EM comprises distributed extrapolation means EM1, . . . EM6, an advantageous embodiment of the present invention is obtained.

When said compensation signal is fed to at least one of said at least one channel amplification means AM1, . . . AM6 by extrapolation by the corresponding said distributed extrapolation means EM1, . . . EM6 and said multiplication with the corresponding said at least one input signal IUS, IUS1, . . . IUS6, an advantageous embodiment of the present invention is obtained.

The present invention further relates to a method for compensating errors of a power signal PS comprising a power supply voltage PSV, comprising the steps of performing multiplicatively power supply voltage dependent signal processing on an input utility signal IUS by means of amplification means AM, establishing a compensation signal CS comprising a representation of the ratio between a desired voltage DV and said power supply voltage PSV, and applying said compensation signal CS to said input utility signal IUS by means of multiplication.

In a preferred embodiment of the present invention said establishment of a compensation signal CS comprises the steps of establishing a forward path fed by a reference signal RS, establishing a negative feedback path from the output PWCS of said forward path, and scaling the signal of said feedback path proportionally with a representation PSVR of said power supply voltage PSV.

According to a preferred embodiment of the present invention, establishing a loop having a forward path and a feedback path, feeding said loop with a reference signal, preferably a square wave signal comprising a mean compensation value, e.g. 0.5, and scaling the feedback signal in proportion with the power supply voltage PSV or a representative thereof PSVR, establishes a compensation signal PWCS being substantially the inverse of the power supply voltage PSV, preferably multiplied by a factor determined by the reference signal RS.

When said establishment of a compensation signal CS comprises the steps of providing an electrical signal PSVR,
providing at least one feedback loop comprising
at least one forward path comprising at least one non-linearity MM and
at least one feedback path comprising at least one variable amplifier BM, feeding to at least one of said at least one variable amplifier said electrical signal PSVR, an advantageous embodiment of the present invention is obtained.

According to a preferred embodiment of the invention, an advantageous way of establishing the reciprocal of a value or signal is obtained. The present embodiment may thus substitute much more complex, demanding and inflexible divider means. The input signal PSVR may be any kind of signal that may be converted to an amplitude signal. The reciprocated signal is established as a pulse width modulated signal, but may easily be demodulated or otherwise converted afterwards.

In a preferred embodiment of the present invention at least one of said at least one forward path is fed with at least one reference signal RS.

According to a preferred embodiment of the invention, a reference signal may be used as input to the forward path in order to establish a factor that is multiplied to the reciprocal of the input signal. Furthermore, such a reference signal may be used to control the pulse width modulation. A preferred reference signal is in this connection e.g. a square wave signal with a duty cycle of 50%.

In a preferred embodiment of the present invention at least one of said at least one feedback loop comprises at least one quantization means QM.

In a preferred embodiment of the present invention at least one of said at least one feedback loop comprises at least one digital-to-analog conversion means DAC.

In a preferred embodiment of the present invention quantization noise introduced at least one of said at least one quantization means QM is shaped by at least one loop filter LF.

According to a preferred embodiment of the invention, noise, in particular quantization noise introduced by the quantization means, may be rejected and/or shaped, e.g. pushed to high frequencies, by means of one or more suitable loop filters.

In a preferred embodiment of the present invention said reference signal RS is an oscillating voltage signal.

A preferred oscillating voltage signal may be a square wave signal with a duty cycle of 50%, but any kind of preferably periodically oscillating signals may be used as reference signals.

In a preferred embodiment of the present invention said non-linearity MM is a limiter.

Preferably the non-linearity comprised by the forward path is a limiter. It is noted that the applicable limiter transfer functions may vary significantly within the scope of the invention, from hard-clipping limiters having only two output values, to the more soft-clipping limiters having several or even infinite output values. The soft-clipping limiters may advantageously be combined with multi-bit PWM quantizers as the transition between one clip and the opposite may be more detailed described.

According to the invention, a non-linearity is required for obtaining the desired combination of oscillation and modulation. Note that soft-clipping non-linearities are also regarded as limiters, even though their maximum or minimum output are basically only reached at infinite. Evidently, several other limiter characteristics may be applied within the scope of the invention In a preferred embodiment of the present invention said non-linearity MM is a comparator.

THE DRAWINGS

The invention will in the following be described with reference to the drawings where FIG. 1 comprises a conceptual diagram of an embodiment of the present invention, FIGS. 2A and 2B show examples of possible amplification means, FIG. 3A to 3C show examples of how the power supply error shapes the output signal with and without compensation, FIG. 4 serves to describe one of the techniques utilized by the present invention, FIG. 5 illustrates an embodiment of a compensation means according to the invention, FIG. 6 shows the frequency response of a possible loop filter, FIG. 7 shows examples of established compensation signals, FIG. 8 shows an example of a real power supply level scaling circuit, FIG. 9 shows principles regarding loop gain and phase margin, FIGS. 10A and 10B shows an embodiment of a possible loop filter, FIGS. 11A and 11B shows a further embodiment of a possible loop filter, FIGS. 12A and 12B shows a preferred embodiment of a possible loop filter, FIGS. 13A and 13B shows a further embodiment of a possible loop filter, FIG. 14 shows an embodiment of a possible anti-alias filter, FIG. 15 shows a frequency response of a possible anti-alias filter, FIGS. 16A and 16B illustrates a possible effect of providing a locking signal, FIG. 17 shows a preferred embodiment of the present invention, and FIG. 18 shows an embodiment of the present invention.

DETAILED DESCRIPTION

FIG. 1 comprises a conceptual diagram of an embodiment of the present invention. It comprises an input utility signal IUS which via a compensated input signal CIS is transformed into an output utility signal OUS by an amplification means AM. The amplification means AM is connected to a power supply means PSM via a power signal PS.

The amplification means AM does not denote any particular amplifier, filter or processing function, but merely represents any point in a signal path where the input signal CIS undergoes processing with a multiplicative relationship with the power supply voltage. When more of such points exist, the amplification means AM represents their overall effect on the input utility signal.

FIGS. 2A and 2B show examples of embodiments of such amplification means AM having a multiplicative relationship to the power supply voltage. Both examples comprise so-called PWM-amplifiers, also in some references referred to as class D amplifiers. FIG. 2A shows an embodiment of an amplification means AM comprising a quantization and noise shaping means QNM, a pulse generation means PGM, a switching means SWM and a filtering means FM. The power supply voltage is coupled to the switching means SWM via the power signal PS. The quantizing and noise shaping means QNM and the pulse generation means PGM serves to modulate the input signal CIS, which is preferably a digital pulse code modulated signal, into a pulse width modulated signal. The switching means SWM scales the PWM signal according to the power supply voltage. The filtering means serves to post-process the signal before any subsequent stages, e.g. demodulating it by means of low-pass filtering.

FIG. 2B comprises a differential PWM amplifier. It comprises the same elements as the embodiment of FIG. 2A, except that two PWM signals are now established by the pulse generation means PGM, and those two PWM signals are scaled by two switching means SWM, post-processed by two filtering means FM, and e.g. sent to each side of a load LD.

It is noted that the present invention may be used with any kind of PWM-amplifier embodiments, or any other kind of amplification or filtering means having a multiplicative relationship with a power supply voltage. For all such amplification means AM it applies that changes in the power supply voltage causes changes in the amplitude of the output signal OUS. As the utility data of a PWM signal is comprised by the combination of the preferably constant amplitude and the widths of the pulses, noise is injected to the signal when the amplitude is changed unintentionally.

The power supply means PSM may be any means that may be used for power supplying an amplification means AM according to the present invention. Such power supply means comprise transformers, batteries, DC, AC or other power sources, and may further comprise rectification means, e.g. diode bridges, stabilization means, e.g. capacitors, regulation means, e.g. voltage or current regulators, etc.

Conventionally the problem of changing or unstable power supply voltage is sought avoided by improving the power supplies, thus seeking to establish a power supply voltage that is as stable and constant as possible. This approach however, involves highly specialized or advanced power supplies, which are expensive, sensitive and inflexible, and which do not facilitate utilization of the full voltage range for amplification. As PWM amplifiers are often used in low cost applications utilizing their high efficiency compared to their cost, the need for such advanced, and more inefficient, power supplies easily undermines the advantages of PWM amplification.

Turning back to FIG. 1, an embodiment of a new approach that may not require improvements of the power supply or amplification means, is proposed. A compensation means CM is connected to the power signal PS, in order to monitor the power supply voltage PSV. The compensation means CM establishes on the basis of the power signal PS a pulse width modulated compensation signal PWCS. This signal represents, by means of a PWM encoding, substantially the reciprocal of the currently applied power supply voltage PSV multiplied by a factor K. The factor K represents a desired power supply voltage DV. When e.g. the currently applied power supply voltage PSV is 80% of the desired voltage DV (which may thus be represented by 100%), the PWM compensation signal PWCS may represent the value:

$$\frac{K}{PSV} = \frac{100\%}{80\%} = 1.25$$

This is the value by which the input utility signal IUS currently should be multiplied in order to compensate for the shortcoming power supply. However, some modulation and encoding differences, in particular different sample rates, prevent the PWM compensation signal PWCS from being used directly for multiplication with the input signal.

Hence, the preferably high-frequency pulse width modulated compensation signal PWCS is decimated, and in this connection low-pass filtered, by means of a decimation means DM. The output of the decimation means is a pulse code modulated compensation signal PCCS. This signal may represent values in the same format, i.e. encoding and rate, as the input utility signal, thus facilitating multiplication of the two signals. However, a further problem exists for most embodiments and applications, in that the time used for the filtering and decimation, and other processes e.g. performed on the input signal subsequent to the multiplication, e.g. PWM modulation, causes the value represented by the PCM compensation signal PCCS to be outdated relative to the current input utility signal IUS.

In order to overcome this, an extrapolation means EM may be inserted. On the basis of the PCM compensation signal PCCS and extrapolation, prediction or another useful method, it should establish an extrapolated compensation signal CS that probably more accurately corresponds to the input value currently represented by the input utility signal IUS.

Eventually the compensation signal CS is applied to the input utility signal IUS by means of a multiplication point MP, thus modifying the input utility signal IUS into a compensated input signal CIS. Thus the compensation signal CS is fed to the amplification means AM via the compensated input signal CIS.

FIG. 3A to 3C exemplifies the compensation principle of the present invention by showing how the different signals in the system develop under different circumstances. All signal diagrams have time in seconds along the x-axis and amplitude on the y-axis. It is noted that the shown signals, their development over time, their frequencies, amplitudes, etc. are only examples, and that the present invention is not restricted to any of the shown signals.

FIG. 3A shows an ideal situation, where the power supply voltage is stable, and no compensation is needed. The first signal shown in FIG. 3A is the power supply voltage PSV. It is as mentioned above stable at 100%. The second signal is the compensation signal CS. It is either absent or it has the value 1.0, which means that the input utility signal is not modified at the multiplication point MP. The third signal is the input utility signal IUS, which for this example carries a constant sinus tone. The fourth signal is the compensated input signal CIS. As mentioned above, this is exactly the same signal as the input utility signal IUS, as the compensation signal constantly has the value 1.0. The last signal is the output utility signal OUS which is the input utility signal IUS amplified by the value of the power supply voltage.

FIG. 3B shows a situation where no compensation is performed. The power supply voltage PSV comprises ripple and thus alternates between approximately 50% and 100%. As the compensation means is absent, the compensation signal has a value of 1.0, which causes no change to the input signal. The input utility signal IUS is the same sinus tone as in FIG. 3A, and because of the absent compensation, the compensated input signal CIS equals the input utility signal IUS. The power supply ripple thus causes the output utility signal OUS to be noisy, as it is scaled according to the noisy power supply voltage PSV.

FIG. 3C shows an example of a situation where a compensation signal CS is established by means of an embodiment of the compensation means of the present invention. The power supply voltage PSV is the same as in FIG. 3B, i.e. it comprises ripple. The compensation means of the present invention establishes, on the basis of the alternating power supply voltage, a compensation signal CS being the reciprocal of the power supply voltage, and multiplied by a factor to normalize it. Thus, the compensation signal alternates between values 1.0 and approximately 1.8. The input utility signal IUS is the same constant sinus tone as in FIGS. 3A and 3B but now the compensated input signal CIS has changed, as it represents the result of multiplying the input utility signal IUS with the compensation signal CS. When this compensated input signal CIS is scaled within the power supply dependent amplification means AM, the output signal OUS is established as a scaled, error-free version of the input utility signal IUS.

The compensation signal CS may be regarded the inverse of the power supply voltage or an inverted representation of the power supply voltage, in the sense that it substantially represents the reciprocal of the power supply voltage, or a scaled representation thereof, and not merely in the sense of mirroring the signal in the zero axis.

It is noted that the compensated input signal CIS should be able to hold sample values corresponding to the highest possible input utility signal value multiplied by the highest possible compensation signal value. Hence, if the resolutions of the input utility signal and the compensated input signal are the same, input data that utilizes the full resolution may be distorted due to clipping.

FIG. 4 is provided for describing one of the techniques behind the compensation means CM of the present invention. It comprises an input signal IS, a forward path with a forward gain FG, an output signal OS, and a feedback path from said output signal OS through a feedback gain BG to a summing point, where the feedback path signal is subtracted from the input signal.

The output signal content $V_{OS}$ thus recursively depends on the input signal $V_{IS}$ in the following way:

$$V_{OS} = FG(V_{IS} - BG \cdot V_{OS})$$

which may be rearranged into:

$$\Leftrightarrow V_{OS}(1 + FG \cdot BG) = FG \cdot V_{IS}$$

$$\Leftrightarrow V_{OS} = \frac{FG}{1 + FG \cdot BG} V_{IS}$$

If the product of FG·BG is much greater than 1, the expression may further be reduced into:

$$\Rightarrow V_{OS} = \big|_{FG \cdot BG \gg 1} \frac{V_{IS}}{BG}$$

From the above expressions are seen that, within certain restrictions, a feedback loop may be used as a divider, where the input signal is divided by the feedback gain BG. This effect is advantageously used by the present invention in order to establish a representation of the reciprocal of a power supply voltage PSV, preferably multiplied by a factor K.

FIG. 5 illustrates a preferred embodiment of a compensation means CM according to an embodiment of the present invention. It comprises a loop, the forward path of which comprises a loop filter LF, a modulation means MM and a quantization means QM, and the feedback path of which comprises a digital-to-analog converter DAC and a buffering means BM. The feedback path is subtracted from the input to the forward path by means of a summing point SP. The loop is fed with a reference signal RS, preferably originating from a square wave generator SG. The output of the circuit corresponds to the above-mentioned PWM compensation signal PWCS, i.e. a pulse width modulated representation of the compensation value.

The quantization means QM is mainly provided in order for the PWM compensation signal PWCS to be in the digital domain, and the digital-to-analog converter DAC is thus required in order to establish an analog feedback signal. It is noted that principally the output PWCS may as well be analog, thus allowing the quantization means and converter to be omitted, but in most real applications the subsequent decimation, filtering and extrapolation processing is at least inexpedient to perform on an analog signal. An analog output of the power supply compensation circuit may be used when the input utility signal IUS is an analog signal e.g. for use as input to an analog PWM modulator. An advantageous alternative to establishing an analog PWM compensation signal PWCS would be to include a digital-to-analog converter subsequent to the extrapolation means EM, in order to convert the compensation signal CS into the analog domain.

The modulation means MM of FIG. 5 modulates the output of the loop filter LF into a PWM signal. The modulation means receives on one input a modulation input signal MIS, and on another input a modulation reference signal MRS. Preferably the modulation means comprises a comparator having the modulation reference signal input tied to a DC value, preferably 0 V. When the modulation input signal MIS comprises a high-frequency signal component, e.g. the reference signal RS, the comparator actually compares the input signal MIS with that high-frequency component. This causes the comparator to establish a PWM signal without need for a sawtooth reference signal as conventional PWM modulators. It is, however, noted that any kind of PWM modulator may be used for modulation means MM, including conventional modulators that require sawtooth or triangular reference inputs, or any other kind of means suitable for establishing a PWM signal. Also PWM modulators establishing any kind of PWM variants, e.g. NPWM, LPWM, etc., may be used for modulation means MM. When the preferred modulation means is used, i.e. a comparator with 0 V DC on the modulation reference signal MRS, the PWM switch frequency $f_{switch}$, i.e. the frequency of PWM periods, becomes the frequency of the high-frequency component, i.e. the frequency of the reference signal RS.

The reference signal RS serves the purpose of representing a reference level, e.g. corresponding to the desired power supply voltage DV, but preferably scaled to match the voltage levels of the compensation circuit. It furthermore preferably serves to provide a high-frequency component to the modulation means MM, thus controlling the PWM modulation. To serve these purposes, the reference signal RS is preferably established by means of a square wave generator SG generating a square wave with a duty cycle of 50%. Such a signal may in itself be considered a constant PWM signal. However, the reference signal RS may be any kind of signal, and may thus be adapted to match different power supplies, output signal requirements, PWM modulation techniques, loop filters, signal coding schemes, etc. As the frequency of the reference signal RS preferably controls the switch frequency $f_{switch}$, as described above, its frequency should at least partly be determined on the basis of knowledge of the frequency of the input utility signal IUS that the compensation circuit interacts with. In order to establish a suitable power supply compensation, the PWM switch frequency is preferably chosen to be in the order of 10-100 times, e.g. 32 times, the input utility signal IUS sample rate. When this for example is an audio signal with a sample rate of e.g. 48 kHz, the reference signal frequency, and thereby the switch frequency $f_{switch}$ preferably is in the order of 500 kHz-5 MHz, e.g. 1.536 MHz. The reference signal may preferably have a peak-to-peak voltage corresponding to the voltage used for the digital circuits, e.g. 3.3 V DC. In such case the above-mentioned factor K is preferably 3.3.

The quantization means QM is illustrated in FIG. 5 as a latch having an input D and an output Q. It is noted that any kind of sample means or analog-to-digital converter may be used instead, e.g. cascade-coupled latches, comparators, etc. The quantization means QM preferably takes a clock signal in addition to the input D, in order to control the sample rate, which preferably is in the order of 50-200 times, e.g. 128 times, the PWM switch frequency $f_{switch}$. The quantization means QM thus samples at a frequency of e.g. 196.6 MHz. The ratio between the switch frequency and the quantizing rate determines the resolution of the output PWM signal, as it preferably is a two-level signal. A ratio of e.g. 128 then allows the PWM edges of the PWM compensation signal PWCS to be established with a precision of 1/128 PWM period.

The loop filter LF as illustrated in the forward path in FIG. 5 represents the joint linear, time invariant filtering made anywhere in the loop. Thus, if a certain desired loop filter characteristic is practically most advantageously obtained by actually performing the filtering in the feedback path or subsequent to the modulation means MM, this is within the scope of the invention as well. The loop filter LF thus represents the equivalence model of all linear, time invariant filtering performed, in order to lighten the description and make the circuit easier to simulate.

A preferred loop filter for a stable loop design comprises simple zeroes at 10 kHz, 47 kHz and 1.8 MHz, simple poles at 1 kHz and 180 kHz, and a complex pole at 17 kHz with a Q of 2. The frequency response of such a loop filter HLF(s) is shown in FIG. 6. As seen, the phase margin never gets below 30 degrees, thus ensuring stability. It is noted that the present invention is not restricted to the mentioned preferred loop filter characteristic, and any kind of loop filter is within the scope of the present invention.

Because of the non-linear PWM modulation, the loop filter LF does not describe the total filtering applied. FIG. 6 thus further comprises a frequency response G(s) that better describes the actual response of the loop. When it comes to small signals, the modulation means MM may be described as a gain element. This is seen from FIG. 6, where G(s) is equal to HLF(s) except from a gain difference of approximately 40 dB in this example. As seen, G(s) intersects with the 0 dB level at the switch frequency $f_{switch}$ i.e. at approximately 1.5 MHz, which is a general property of PWM modulation loops, as seen from the references cited above.

A major objective of the loop filter is to reject quantization noise established by the relatively low-resolution quantization means QM. As the loop filter equivalence model is positioned first in the feedback path, noise injected subsequently to the feedback path, e.g. by the comparator and especially by the quantization means QM, is rejected by the loop filter characteristic proposed.

Seen from the noise injection point, i.e. the quantizing means QM, the actual loop characteristic G(s) causes a frequency response of:

$$\frac{1}{G(s)+1}$$

This response is also shown in FIG. 6, where it is seen that it rejects noise within a particular frequency band and let high-frequency noise through. This noise shaping is utilized at subsequent stages, i.e. within the decimation means DM, as the anti-aliasing performed there is able to cut away the high-frequency noise, but has to let low-frequency content through. Thereby an advantageous method of rejecting noise, in particular quantization errors, is obtained.

The loop filter LF may as well facilitate self-oscillating PWM modulation. By designing the loop filter in such a way that the loop causes a phase shift of −180° at a certain frequency, the loop may attain a state of controlled self-oscillation at that frequency, i.e. the switch frequency. Examples of such self-oscillating modulators are WO 00/42702, WO 02/25357, WO 02/093973, U.S. Pat. No. 6,118,336, WO 98/19391, WO 00/27028, U.S. Pat. No. 6,249,182 and the yet unpublished patent applications PCT/DK03/00447, PCT/DK03/00613 and PCT/DK2004/000643 all hereby included by reference with respect to different basic principles and possible embodiments regarding the establishment and controlling of the desired oscillation in combination with the desired modulation.

An ideal frequency response may look like the diagram in FIG. 9. It comprises a logarithmic gain characteristic and a phase shift characteristic of the transfer function of the open loop, $T_{OL}(S)$ of a self-oscillating loop. The gain characteristic is shown with asymptotic curves. The frequency axes are logarithmic.

Vertical, dashed lines indicate three specific frequencies, a low frequency $f_{DC}$, the upper frequency $f_0$ of the utility frequency band and the higher switch frequency $f_{SW}$ that drives the PWM modulation. The gain characteristic is shown to have a flat gain DCG from 0 Hz to the low frequency $f_{DC}$ where it then rolls off. Due to the self-oscillation it intersects with 0 dB at the switch frequency $f_{SW}$. As the DC gain DCG is desired to be as high as possible to obtain the best noise suppression, and it is always 0 dB at the switching frequency $f_{SW}$ the slope of the rolling off gain characteristic determines the interval between the two frequencies. Thus, the higher the switch frequency is in relation to the low frequency $f_{DC}$ and the steeper the gain slope, the higher DC gain DCG is obtainable.

As a desired DC gain DCG is often specified beforehand due to a need or desire of a specific signal/noise ratio, the last parameters, the slope and nature of the roll off and the position of the low frequency $f_{DC}$ and the switch frequency $f_{SW}$ have to achieve this. As they are tightly bound to each other their determination is often a balancing. A relatively low switch frequency $f_{SW}$ may reduce the demands on the non-linearity or comparator, a possible switch mode amplifier, and the other components in the loop but on the other hand it will require higher ordered filtering means to create a steeper gain roll off. On the other hand, a gently decreasing gain requires a high switch frequency $f_{SW}$ but there is often an upper limit to that frequency as especially the switch mode amplifier introduce an intolerable high level of errors to signals above a certain frequency.

The phase shift characteristic shown in FIG. 9 illustrates the boundaries that the phase shift of an open loop characteristic of a self-oscillating circuit should observe. At frequencies below the switch frequency $f_{SW}$ including the utility frequency band the phase shift should be above −180°, at the switch frequency the phase shift characteristic intersects with −180° and at higher frequencies assumes a value below −180°. The angle that lacks in order for the phase shift to be −180° within the utility frequency band is denoted utility band phase margin UPM. This should be as small as possible at as low a frequency as possible in order to obtain the steepest possible gain slope and the earliest possible gain roll off, respectively. Practically, there is however a minimum utility band phase margin UPM in order to ensure stability for all frequencies below the switch frequency $f_{SW}$. This minimum phase margin varies for different embodiments and depends e.g. on the robustness of the circuit, the kind of input signal, the component quality, etc. In a preferred embodiment of the invention, the minimum phase margin is 10° to 20°. In order to obtain a circuit with a relatively small phase margin a relatively high order filtering means with properly positioned filter poles and filter zeroes are required.

The phase characteristic may be controlled by means of delays, filtering means, etc. The comparator means introduce a small delay. To control the phase, i.e. ensuring self-oscillation at the right frequency, filtering means have to be adapted for that purpose. The higher order of the filtering means, the better the phase may be controlled.

FIGS. 10A and 10B illustrate an embodiment of the present invention. FIG. 10A is a logarithmic gain plot of the embodiment where the positions of filter poles and filter zeroes are indicated by means of crosses and circles, respectively. FIG. 10B is a phase margin plot according to the gain plot of FIG. 10A. The filter poles and filter zeroes are also indicated on this plot though positioned at the same frequencies as in FIG. 10A.

As seen, the gain curve intersects with 0 dB at 400 kHz and the phase margin is for that frequency accordingly 0°. Thus, this frequency is the switch frequency of this example embodiment. The present embodiment comprises nine filter poles and six filter zeroes and is thus a ninth order system. The six filter zeroes are paired to the second to seventh filter poles and spaced a little to the left of each corresponding pole. Because of the high order, a relatively flat phase margin curve and a relatively linear negative gain slope is achieved for most of the utility frequency band which in this embodiment is the audio band. The phase margin in the utility band decreases to 60° corresponding to a phase shift of −120° and the slope of the gain curve is about −25 dB per decade. The linear gain slope and flat phase margin in the utility band resembles the curves of a first order or second order filter except that the gain slope of a first order filter would be −20 dB per decade and the phase margin 90° and of a second order filter would be −40 dB per decade and 0°. Thus, the present embodiment performs better than a simple first order system because of steeper slope and smaller phase margin without becoming a second order system which would be unstable at low frequencies. The utility band of the present embodiment may be described as having an effective order of −25 dB/−20 dB=1,25.

With the embodiment of FIGS. 10A and 10B, an open loop gain of about 130 dB at DC and 70 dB at 1 kHz is obtained.

FIGS. 11A and 11B illustrate a further embodiment of the present invention. FIG. 11A is a logarithmic gain plot of the embodiment where the positions of filter poles and filter zeroes are indicated by means of crosses and circles, respectively. FIG. 11B is a phase margin plot according to the gain plot of FIG. 11A. The filter poles and filter zeroes are also indicated on this plot though positioned at the same frequencies as in FIG. 11A.

As with the embodiment of FIGS. 10A and 10B the switch frequency of this example embodiment is 400 kHz. The present embodiment again comprises nine filter poles and six filter zeroes and is thus again a ninth order system. The six filter zeroes are again paired to the second to seventh filter poles but are in this embodiment spaced a little longer to the left of each corresponding pole than with the embodiment of FIGS. 10A and 10B. Again, because of the high order, a relatively flat phase margin curve and a relatively linear negative gain slope are achieved for most of the utility frequency band which in this embodiment is the audio band. The phase margin in the utility band decreases to 45° corresponding to a phase shift of −135° and the slope of the gain curve is about −30 dB per decade. The utility band of the present embodiment may be described as having an effective order of −30 dB/−20 dB=1,5.

With the embodiment of FIGS. 11A and 11B, an open loop gain of about 140 dB at DC and 80 dB at 1 kHz is obtained.

FIG. 12A is a logarithmic gain plot of the embodiment where the positions of filter poles and filter zeroes are indicated by means of crosses and circles, respectively.

FIG. 12B is a phase margin plot according to the gain plot of FIG. 12A. The filter poles and filter zeroes are also indicated on this plot though positioned at the same frequencies as in FIG. 12A.

Figure 10A:
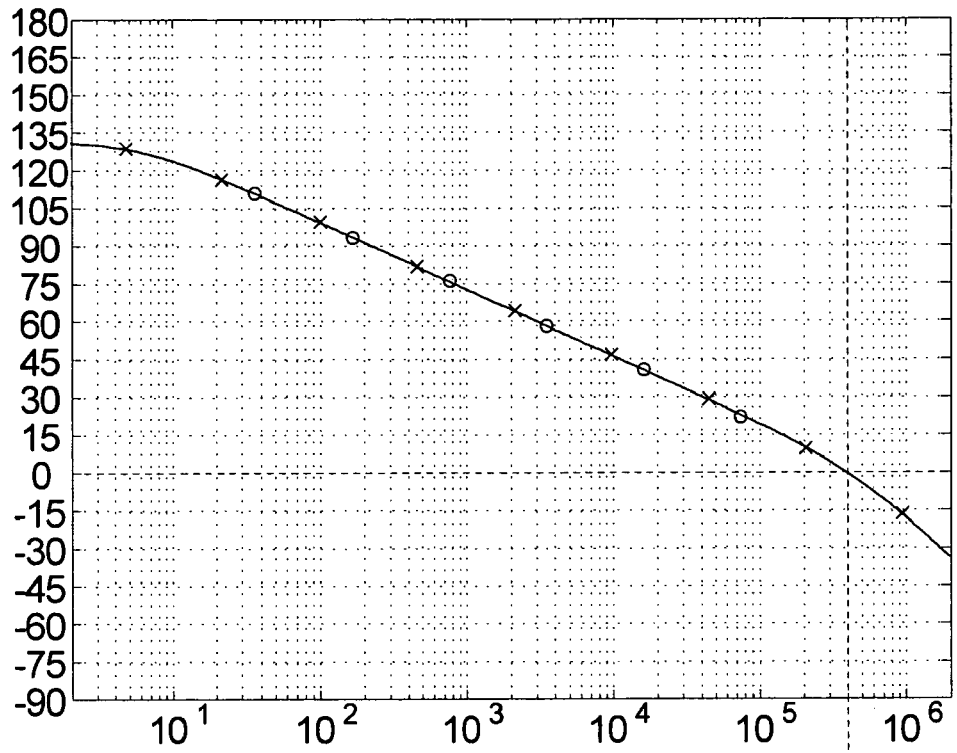
Figure 10B:
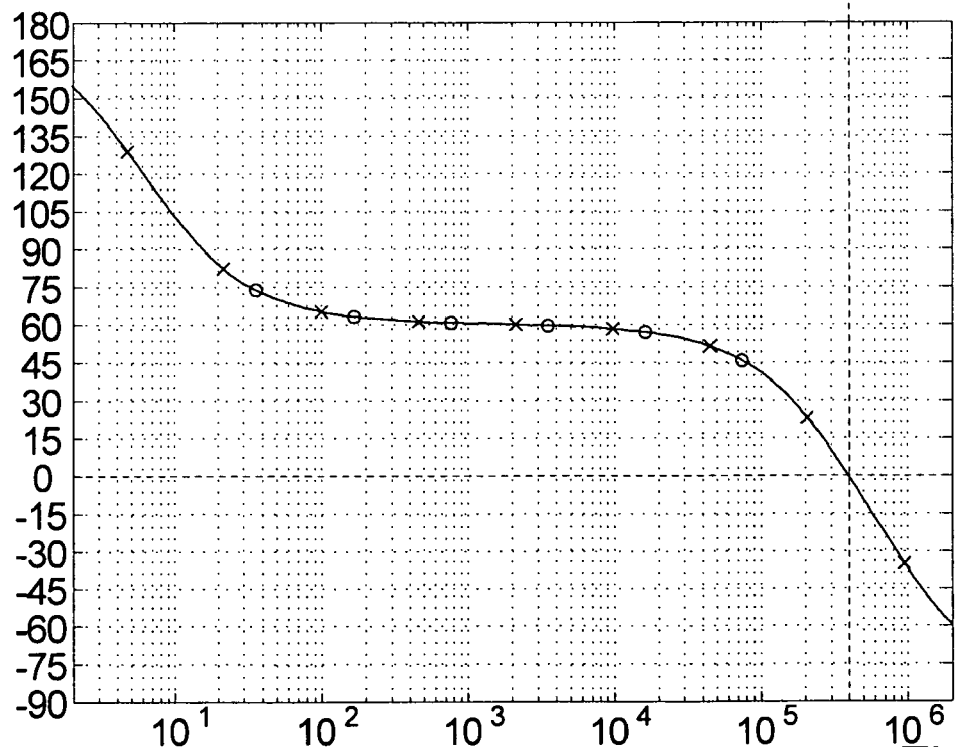
Figure 11A:
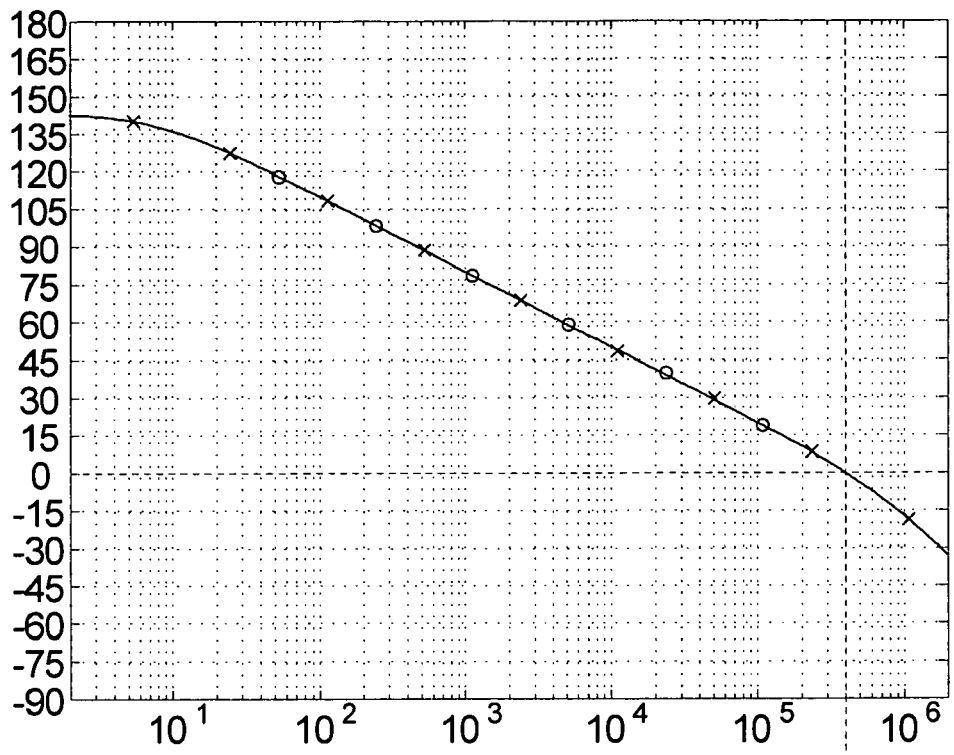
Figure 11B:
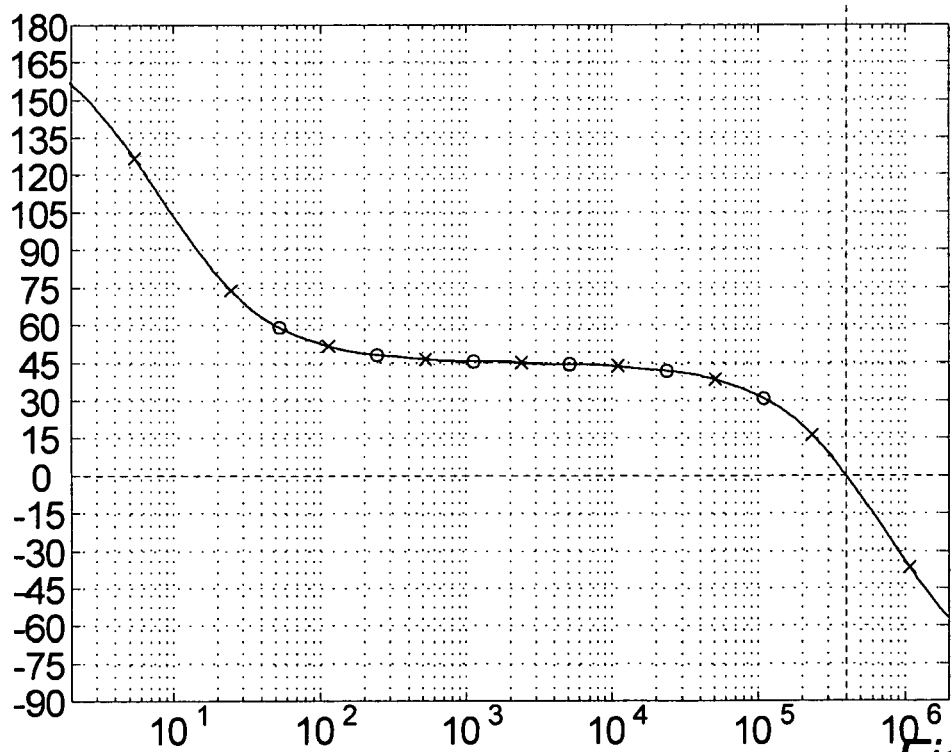

As with the embodiment of FIGS. 10A and 10B and of FIGS. 11A and 11B, the switch frequency of this exemplary embodiment is 400 kHz. The present embodiment again comprises nine filter poles and six filter zeroes and is thus again a ninth order system. The six filter zeroes are again paired to the second to seventh filter poles but are in this embodiment spaced even more to the left of each corresponding pole than with the embodiment of FIGS. 11A and 11B. Again because of the high order a relatively flat phase margin curve and a relatively linear negative gain slope is achieved for most of the utility frequency band which in this embodiment is the audio band. The phase margin in the utility band decreases to 30° corresponding to a phase shift of −150° and the slope of the gain curve is about −35 dB per decade. The utility band of the present embodiment may be described as having an effective order of −35 dB/−20 dB=1,75.

Figure 12A:
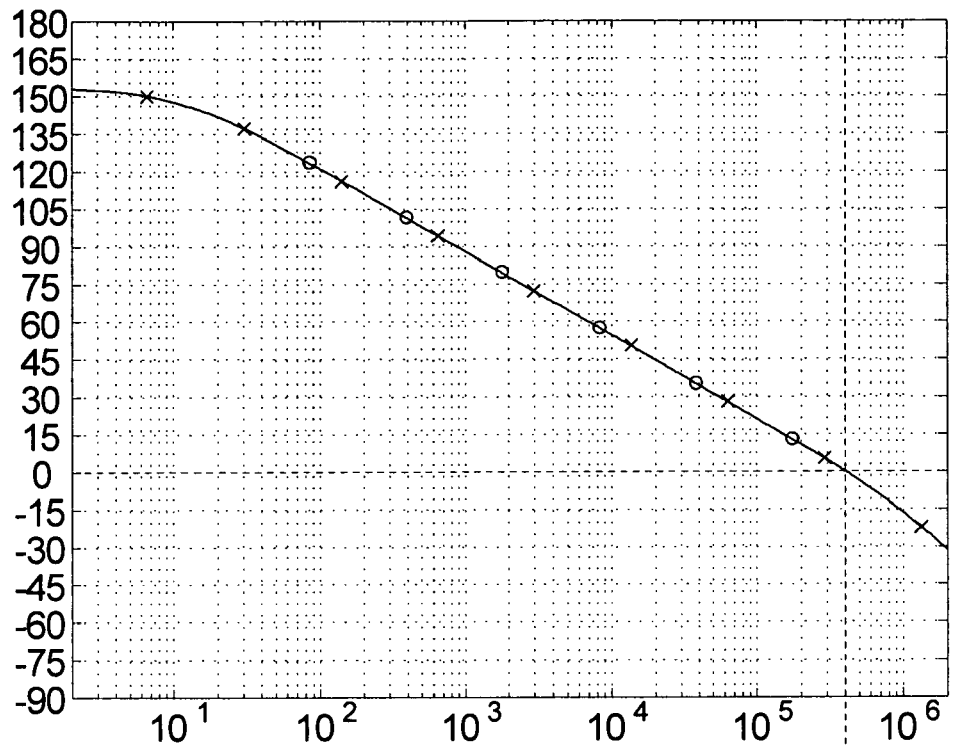
FIGS. 12A and 12B illustrate a preferred embodiment of the present invention.
Figure 12B:
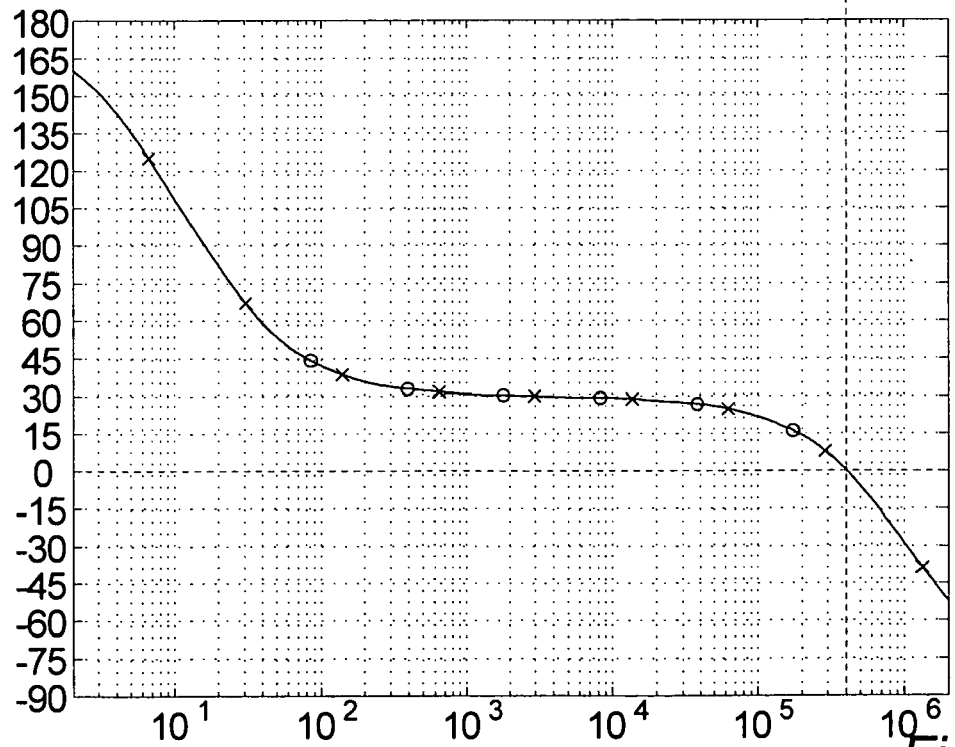

With the embodiment of FIGS. 12A and 12B, an open loop gain of more than 150 dB at DC and almost 90 dB at 1 kHz is obtained.

Figure 13A:
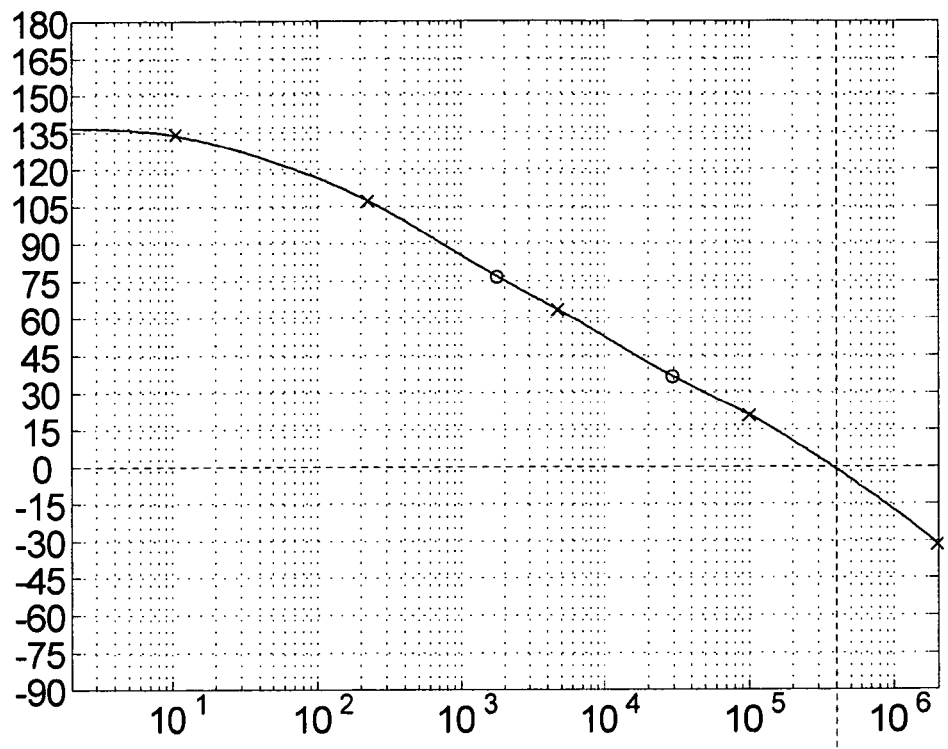
Figure 13B:
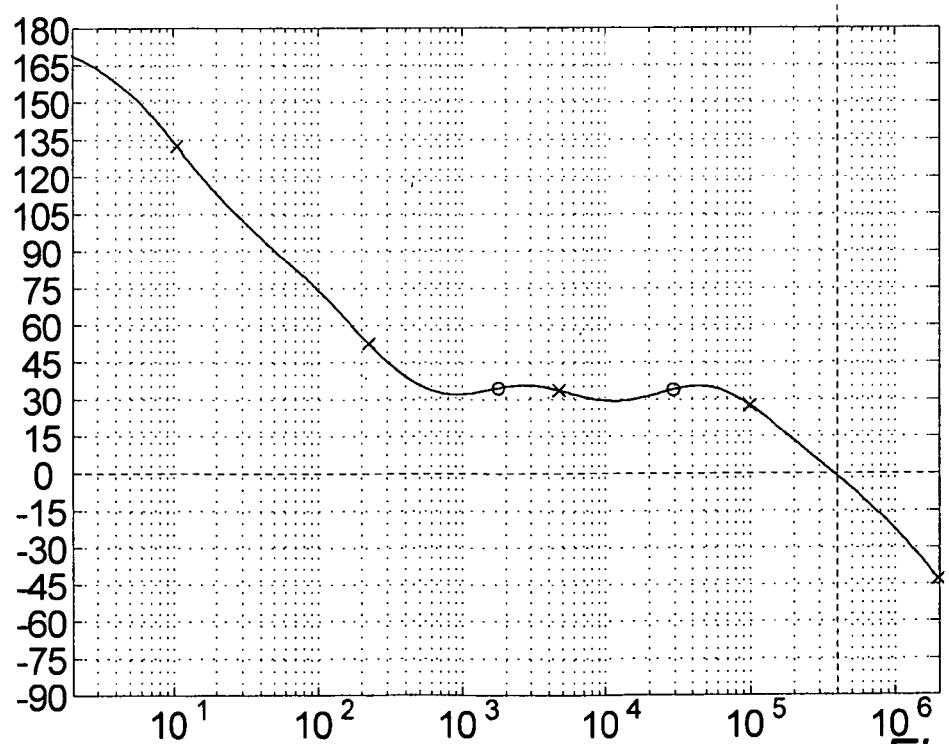

FIGS. 13A and 13B illustrate an even further embodiment of the present invention. FIG. 13A is a logarithmic gain plot of the embodiment where the positions of filter poles and filter zeroes are indicated by means of crosses and circles, respectively. FIG. 13B is a phase margin plot according to the gain plot of FIG. 13A. The filter poles and filter zeroes are also indicated on this plot though positioned at the same frequencies as in FIG. 13A.

As with the embodiment of FIGS. 10A and 10B and of FIGS. 11A and 11B, the switch frequency of this exemplary embodiment is 400 kHz. However, the present embodiment only comprises five filter poles and two filter zeroes and is thus a fifth order system. The two filter zeroes are paired to the second and third filter poles, and are in this embodiment spaced relative far to the left of each corresponding pole. Because of the lower order, relative to the three above-described embodiments the phase margin curve does not become flat though it fluctuates around an average value and the gain slope is not quite linear. The phase margin in the utility band decreases to an average value of about 35° corresponding to a phase shift of −145°.

With the embodiment of FIGS. 13A and 13B, an open loop gain of about 135 dB at DC and about 80 dB at 1 kHz is obtained.

It is noted that even though the modulation is self-oscillating, the switch frequency will be more or less locked due to the reference signal RS, as long as this a periodically oscillating signal. Whereas the locking effect of the reference signal is most often preferred and sought for in self-oscillating loops, the relatively high amplitude of the above-mentioned preferred type of reference signal, i.e. a square-wave signal with a duty-cycle of 50%, may however cause some degree of disturbance to the loop.

Hence, when the loop filter is designed for self-oscillation, the reference signal RS may preferably be a DC-value with a small oscillating overlay signal for controlling the oscillation frequency. The oscillating overlay signal may, e.g., have an amplitude of, e.g., 5% of the reference signal amplitude. The locking signal, i.e. the oscillating signal, does not have to be applied to the reference signal itself, but may be applied anywhere else in the circuit, preferably in the amplitude-continuous domain.

The oscillation of the reference signal RS, e.g. the oscillating overlay signal, should preferably be synchronized with the clock and/or rate used for the amplification means. Preferably the reference signal is synchronized with the input utility signal, an upsampled representation of the input utility signal or the switch frequency of a possible PWM output amplifier stage. One advantageous way to achieve such synchronization is to use a representation of one of the clock signals used elsewhere in the amplifier as reference signal or oscillating overlay signal.

Figure 16A:
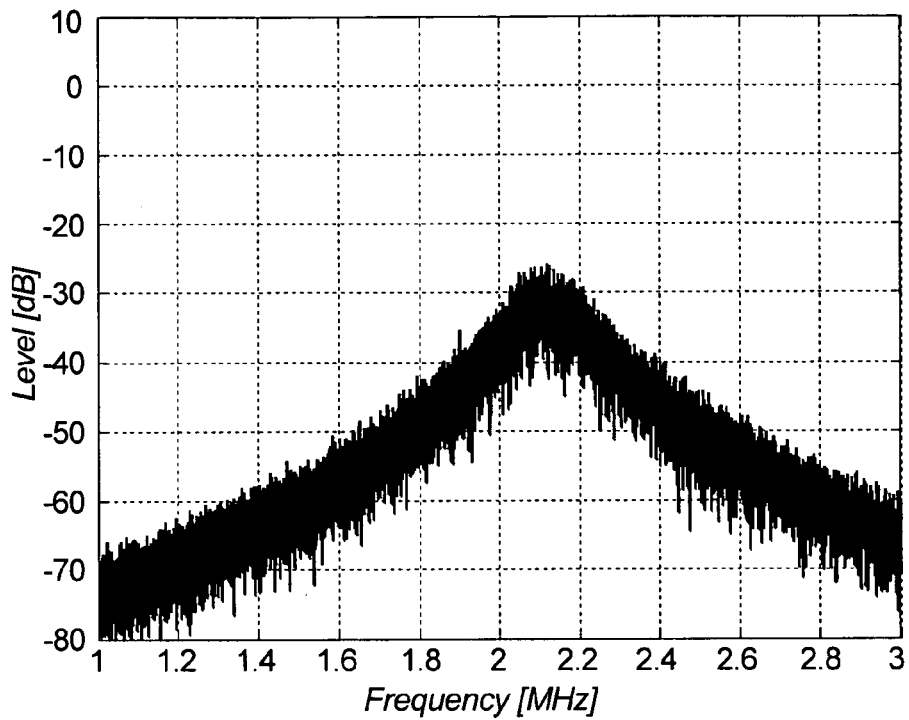
Figure 16B:
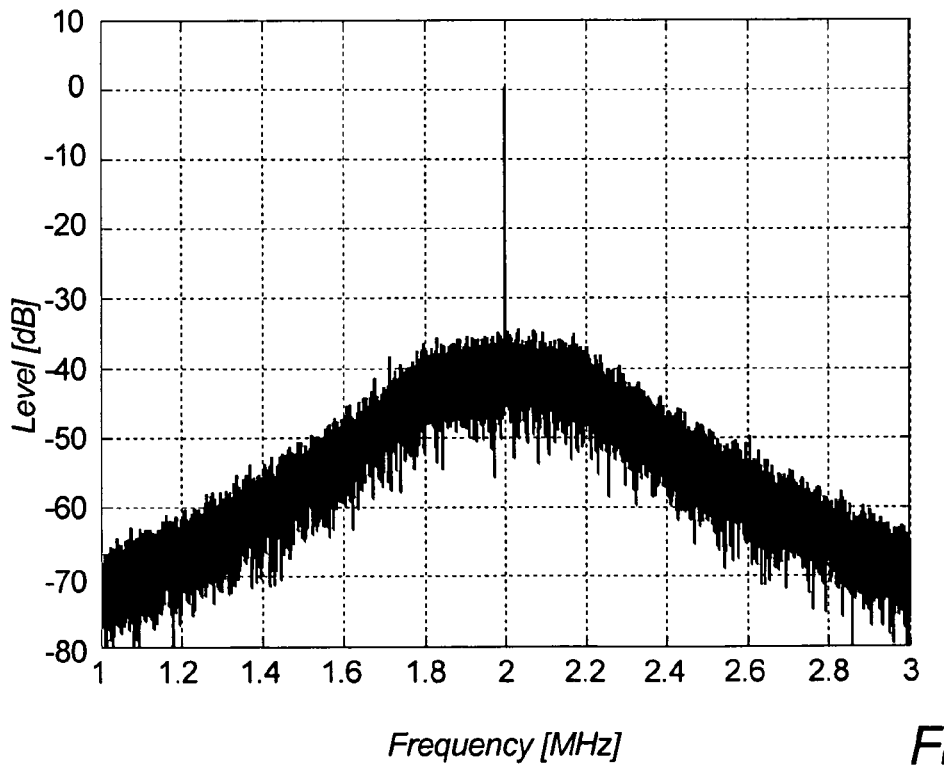

The result of applying an additional periodic signal as described above can be seen from FIGS. 16A and 16B. Both figures are spectrums obtainable from a particular embodiment of the present invention, where the desired switch frequency, i.e. PWM period frequency, is chosen to be 2 MHz. FIG. 16A illustrates the spectrum when no additional signal is applied, and shows the spectrum for frequencies within the range of 1 MHz to 3 MHz. The spectrum is expected to peak at about 2 MHz, but as seen from FIG. 16A the specific peak frequency is rather unclear, and it is actually rather at 2.1 MHz. FIG. 16B illustrates the spectrum of the same particular embodiment as for FIG. 16A, but this time an additional periodic signal with an amplitude of 5% of the reference signal amplitude is applied. As can be seen from FIG. 16B the spectrum of this embodiment clearly comprises a significant peak at rather precisely 2 MHz.

Further methods of controlling the switch frequency in a self-oscillating PWM modulation loop are disclosed and discussed in the yet unpublished patent applications PCT/DK03/00613 and PCT/DK2004/000643, hereby incorporated by reference.

The buffering means BM scales the feedback signal according to a power supply voltage representation PSVR. It may be any kind of amplifier, filter, multiplication and/or divider means, etc. that is able to suit the purpose of modifying the feedback signal into a signal that represents the current power supply voltage PSV. In a preferred embodiment the buffering means BM comprises specifications that corresponds directly or as a representation, to the specifications of the amplification means AM. If the specifications of the buffering means BM are similar to the specifications of the amplification means AM, and only significantly different due to scaling, the influence of the amplification means may be represented by proper scaling of the involved signals. It takes as input a power supply voltage representation PSVR, which preferably is a downscaled representation of the power supply voltage PSV provided by the power supply means PSM. Alternatively the buffering means BM may take any kind of signal that in some way represents the power signal, e.g. a pre-scaled signal, a modulated or converted signal, etc. The scaling of the power supply voltage should ensure that the ratio between the desired voltage DV and the power supply voltage PSV is mirrored by the ratio between the reference signal RS voltage and the power supply voltage representation PSVR.

Figure 4:
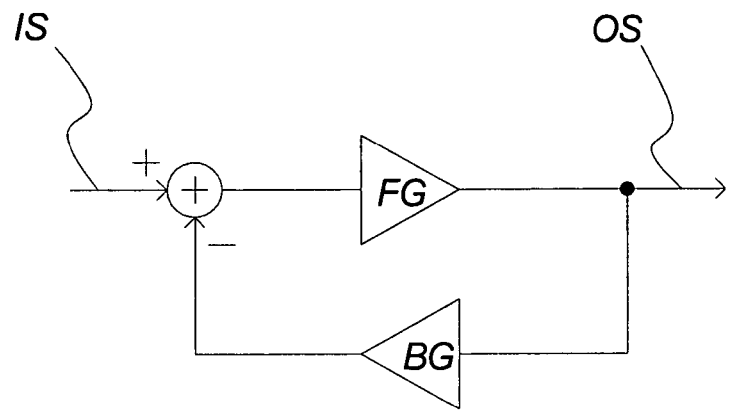

As described with reference to FIG. 4, multiplications performed on the feedback signal are experienced from the output of the loop as divisions of the input signal. Thus, scaling the feedback signal according to the power supply voltage PSV or a representative thereof, causes the output signal PWCS to be divided by the power supply voltage PSV, or the representative thereof. Thus an advantageous method of obtaining the reciprocal of an erroneous signal, in order to be able to compensate for it, is obtained.

The above-illustrated power voltage inverting circuit may basically be designed according to the principles of the patent-application PCT/DK03/00613 "Self-oscillating A/D-converter", hereby included by reference in the sense that a voltage power depending amplification is added in the feedback loop of the converter and that the A/D-converter is fed by a reference signal, preferably a square wave level generator, to which the feedback signal may be compared by subtraction. The resulting output of the inverting circuit will then be a digital inverse representation of the analog variation of the power supply.

Thus, according to an embodiment of the invention, the critical analog power supply voltage level may be compared to a stable reference, typically low voltage and therefore relatively well defined, and an inverse digital representation of the variation of the power supply may be directly output in a digital form suitable for pre-compensation prior to a non-linear modulation of the signal.

Figure 7:
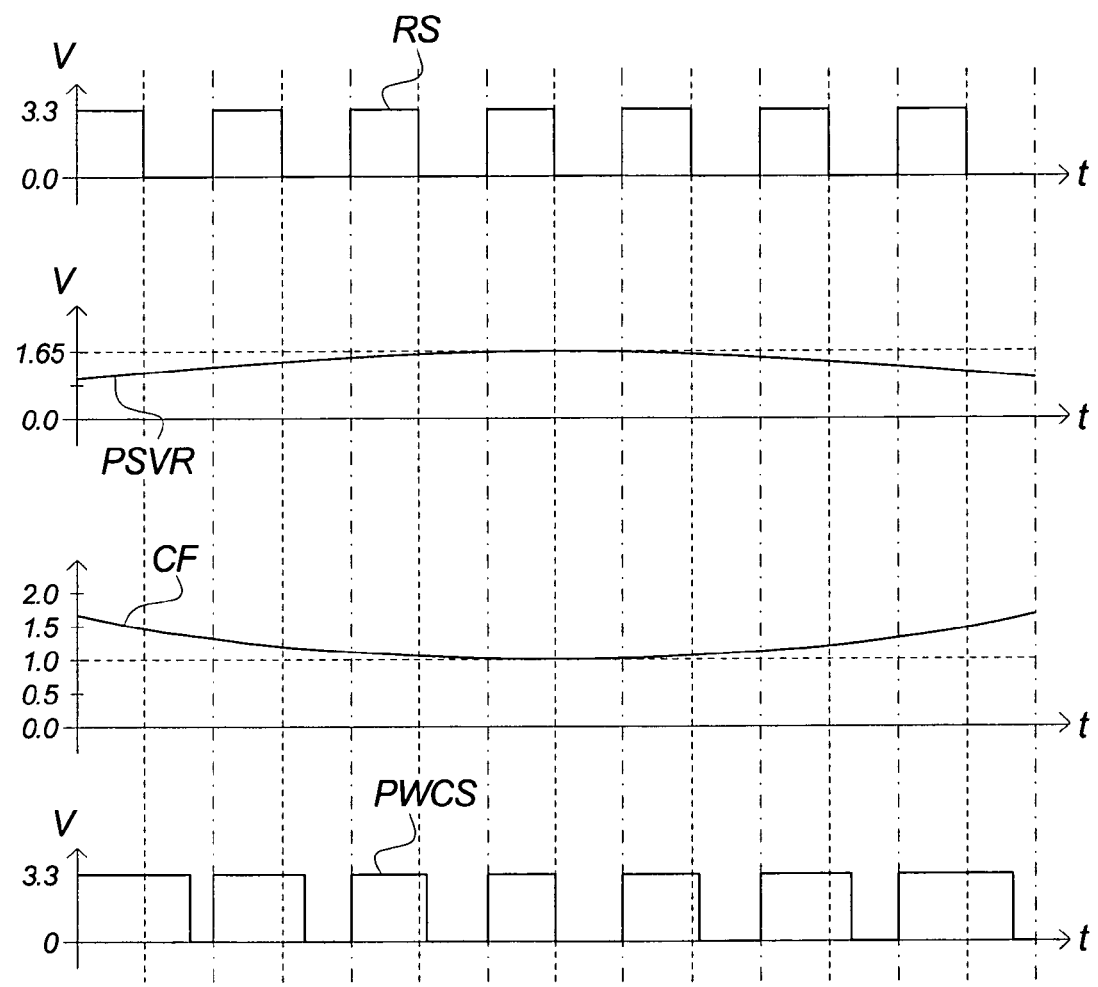

FIG. 7 illustrates how the PWM compensation signal PWCS, i.e. the output of the loop, may be established. The first timing diagram of FIG. 7 shows an example of a reference signal RS. It is a square wave signal with a duty cycle of 50% and a voltage of 3.3 V e.g. according to the power source supplying the digital circuits of the system. Vertical, dashed lines indicate its periods and half-periods in order to compare with the lower diagrams.

The second diagram shows an example of a possible power supply voltage representation PSVR, established by dividing the power supply voltage PSV with the factor by which the desired voltage DV is greater than the reference signal RS mean voltage i.e. 1.65 V. The next diagram shows the compensation factor CF that is the result of dividing the reference signal RS mean voltage of 1.65 V with the power supply voltage representation PSVR, and which may be established by the compensation means circuit shown in FIG. 5. In a preferred system the frequency of the reference signal RS indicated by the vertical dashed lines would be much faster compared to the changes of the power supply voltage PSV, but due to clarity a lower frequency is chosen, so in FIG. 7 a significant change of the power supply voltage takes place for each reference signal period.

The last diagram of FIG. 7 shows an example of the resulting PWM compensation signal PWCS. It comprises a pulse width modulation of the compensation factor CF. It is modulated so that a duty cycle of 50% indicates a compensation factor of 1.0, a duty cycle of 0% indicates a compensation factor of 0.0, and a duty cycle of 100% a compensation factor of 2.0. Thus, a compensation factor CF of e.g. 1.667, which is the first compensation factor value in the example, causes a PWM period with a duty cycle of 83.33% to be established, and a compensation factor CF of e.g. 1.3 causes a PWM period with a duty cycle of 65%. The duty cycle is calculated as the compensation factor CF multiplied by 50%. It is noted that the scope of the present invention is not in any way restricted to the example values of FIG. 7, and that any modulation scheme for the PWM compensation signal PWCS may be chosen. Any alternative modulation schemes, e.g. which are able to handle compensation factors greater than 2.0, or increases the resolution of a particular range, e.g. by only handling compensation factors in the range 1.2 to 1.5, are within the scope of the present invention, and may be preferred for a particular application.

Figure 5:
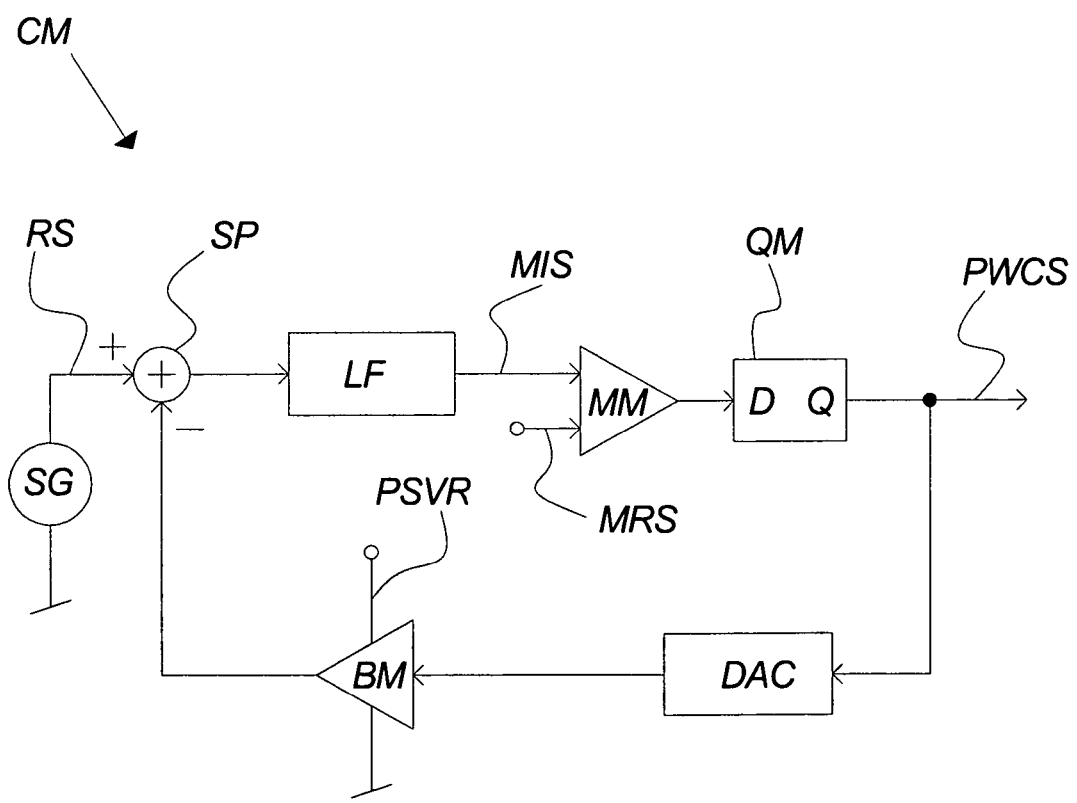
Figure 6:
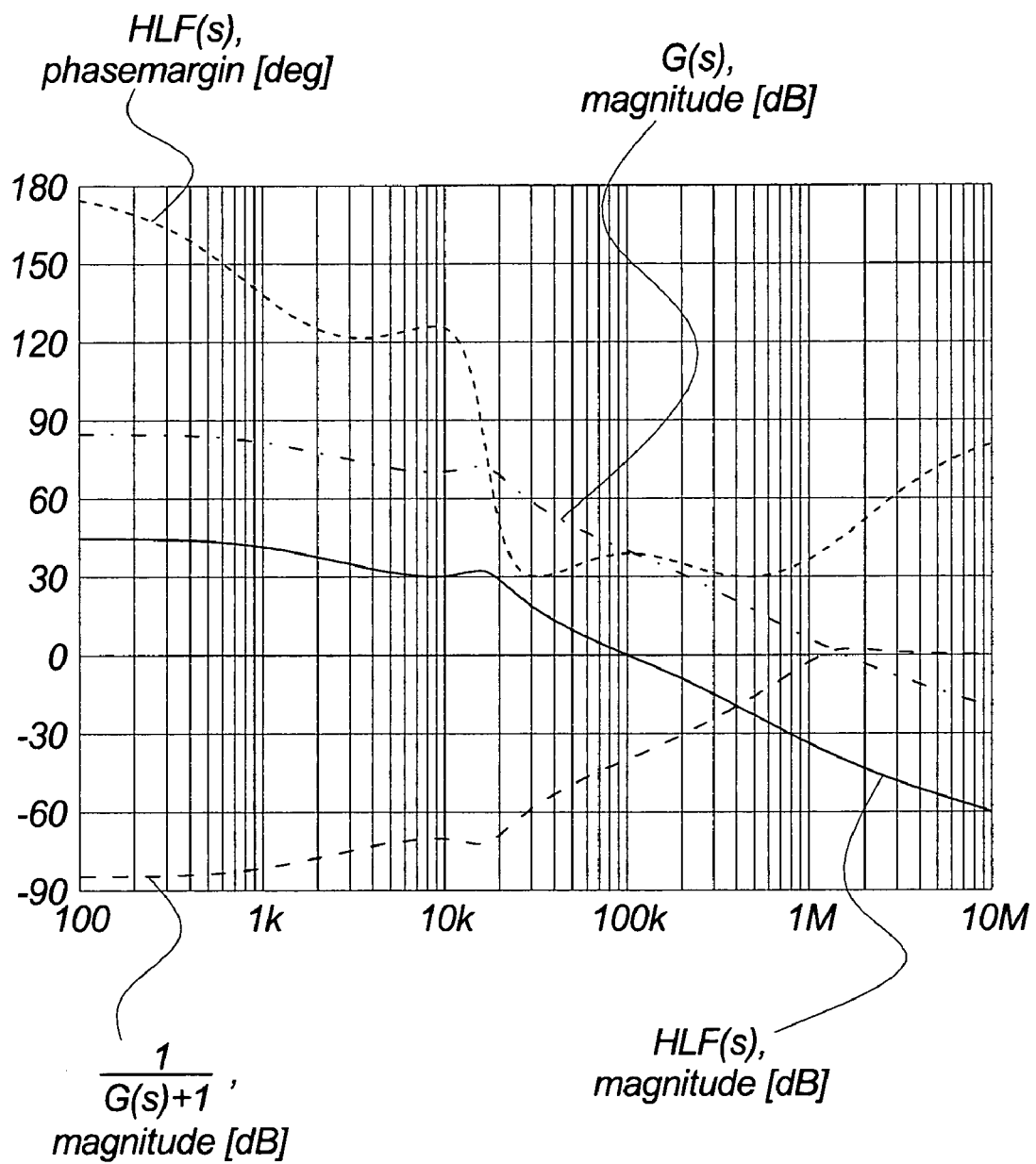

The digital-to-analog converter DAC of FIG. 5 may be any suitable kind of means for converting a digital PWM signal into an analog PWM signal.

Figure 8:
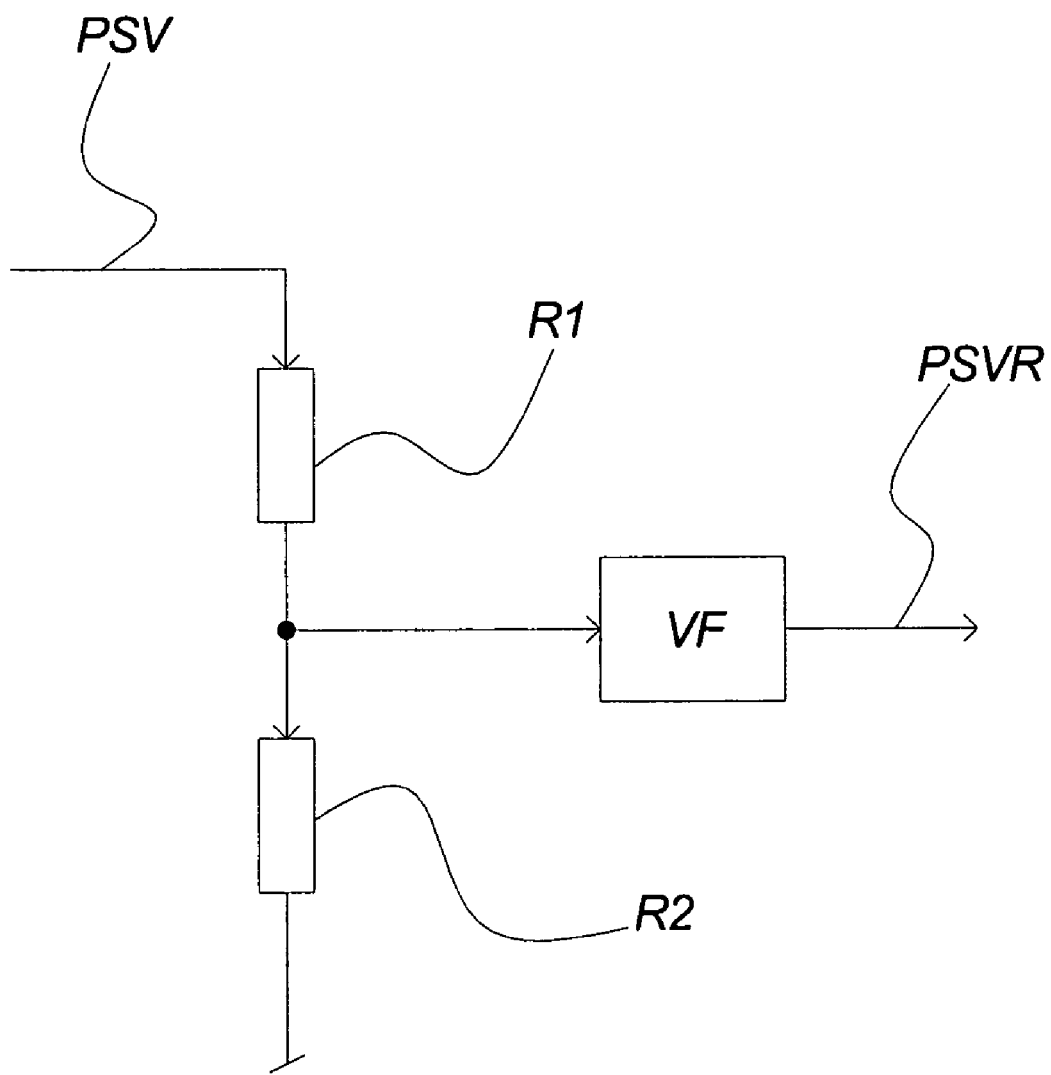
Figure 9:
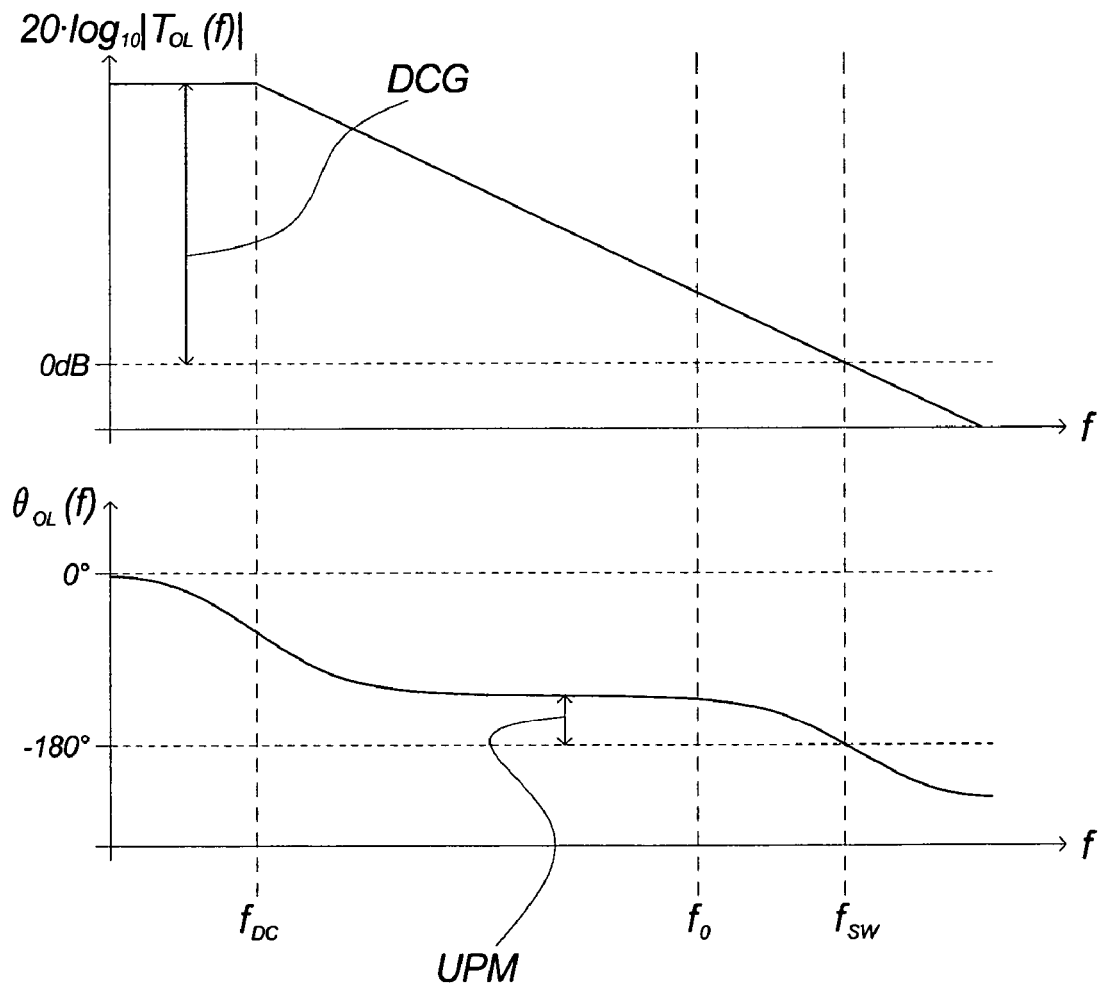

FIG. 8 shows an example of an embodiment of a means for establishing the power supply voltage representation PSVR on the basis of the power supply voltage PSV. Two resistors R1 and R2 establishes a conventional voltage divider, and a voltage follower VF ensures that the power supply means PSM is not loaded with any subsequent circuits to which the power supply voltage representation PSVR is fed. The resistors of the voltage divider may be any kind of resistors. Their mutual dimensions determine the factor by which the power supply voltage PSV is divided. When a power supply voltage representation PSVR of e.g. $1/15$ of the power supply voltage PSV is desired, the second resistor R2 should have a resistance 14 times greater than the resistance of the first resistor R1, i.e. $PSVR=PSV \cdot R1/R1+R2$. Example dimensions may in the case of PSVR being $1/15$ of PSV be e.g. 1 kΩ for the first resistor R1, and 14 kΩ for the second resistor R2.

The voltage follower VF may be any kind of circuit that provides high, preferably infinite, input resistance, and still delivers the input voltage unchanged on the output. Thereby the divided power supply voltage may be conveyed to the power supply voltage representation PSVR without loading the power supply means PSM that provides the power supply voltage PSV. Preferably the voltage follower VF comprises an operational amplifier having the divided power supply voltage coupled to its positive input, and its output fed back unchanged to its negative input. The voltage follower should be power supplied by a voltage source greater than the divided power supply voltage, e.g. by a voltage corresponding to the power supply voltage PSV. It is noted that any other suitable buffering circuit may be used instead of the described, e.g. differential buffering, etc.

The factor by which the power supply voltage PSV is divided preferably corresponds to the factor by which the voltage DV desired for the switching amplifier is greater than the means voltage of the reference signal RS. When e.g. the reference signal RS is a square wave with a mean voltage of 1.65 V, i.e. a peak voltage of 3.3 V, and a voltage of 25 V is desired for the switching amplifier, the power supply voltage representation PSVR should be $3.3/25 \approx 1/15$ of the power supply voltage PSV.

It is noted that the present invention is not restricted to any particular scale correspondence between the different signals. Even when the ratio between the power supply voltage PSV and the power supply voltage representation PSVR is different than the ratio between the desired voltage DV and the reference signal RS, the present invention will still cause the power supply errors to be compensated, together with a scaling of the utility signal. Thus, by changing the ratio of PSV/PSVR or the reference signal RS, the desired voltage may be changed, and thus the virtual switch voltage. It is moreover noted that it is important that the power supply voltage representation PSVR except for a general scaling factor represents the power supply voltage PSV as accurately as possible, i.e. without any filtering, as otherwise incorrect compensation factors may be established.

Figure 1:
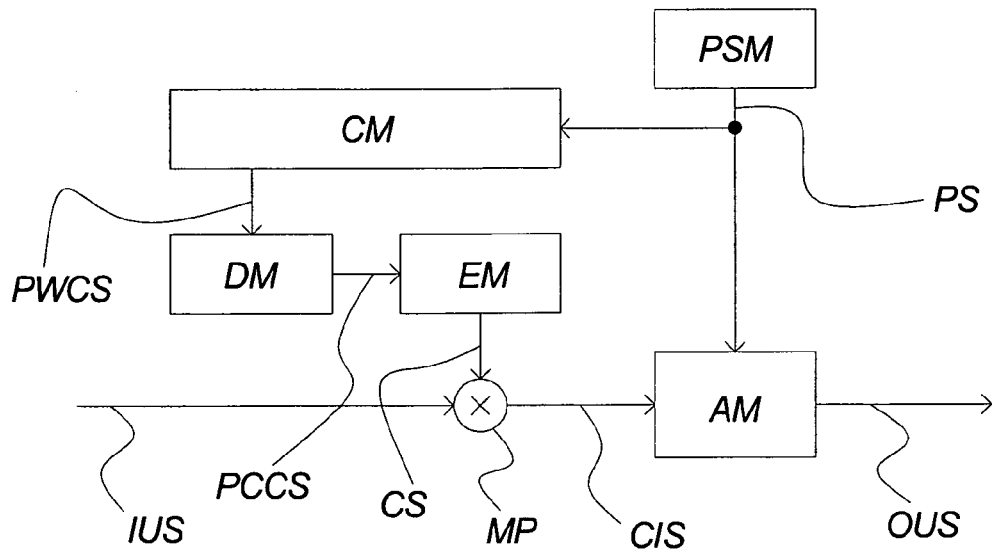
Figure 2A:
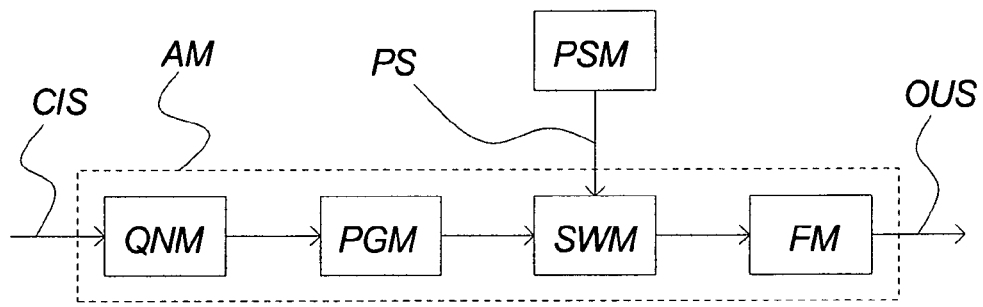
Figure 2B:
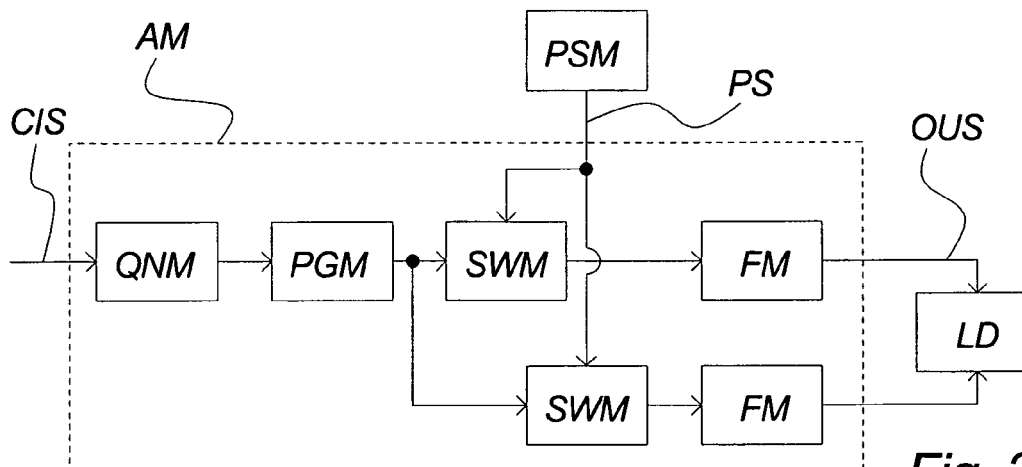
Figure 3A:
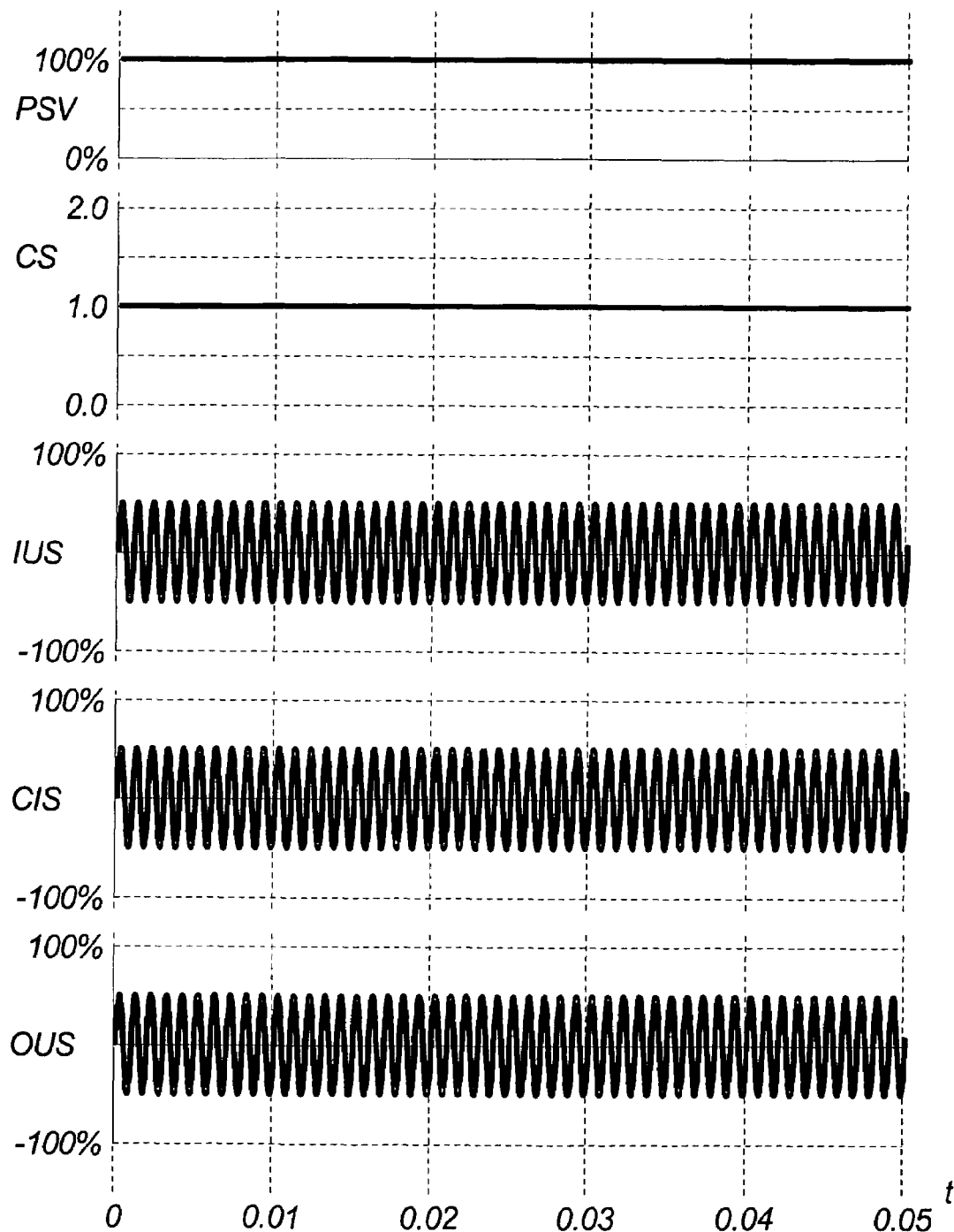
Figure 3B:
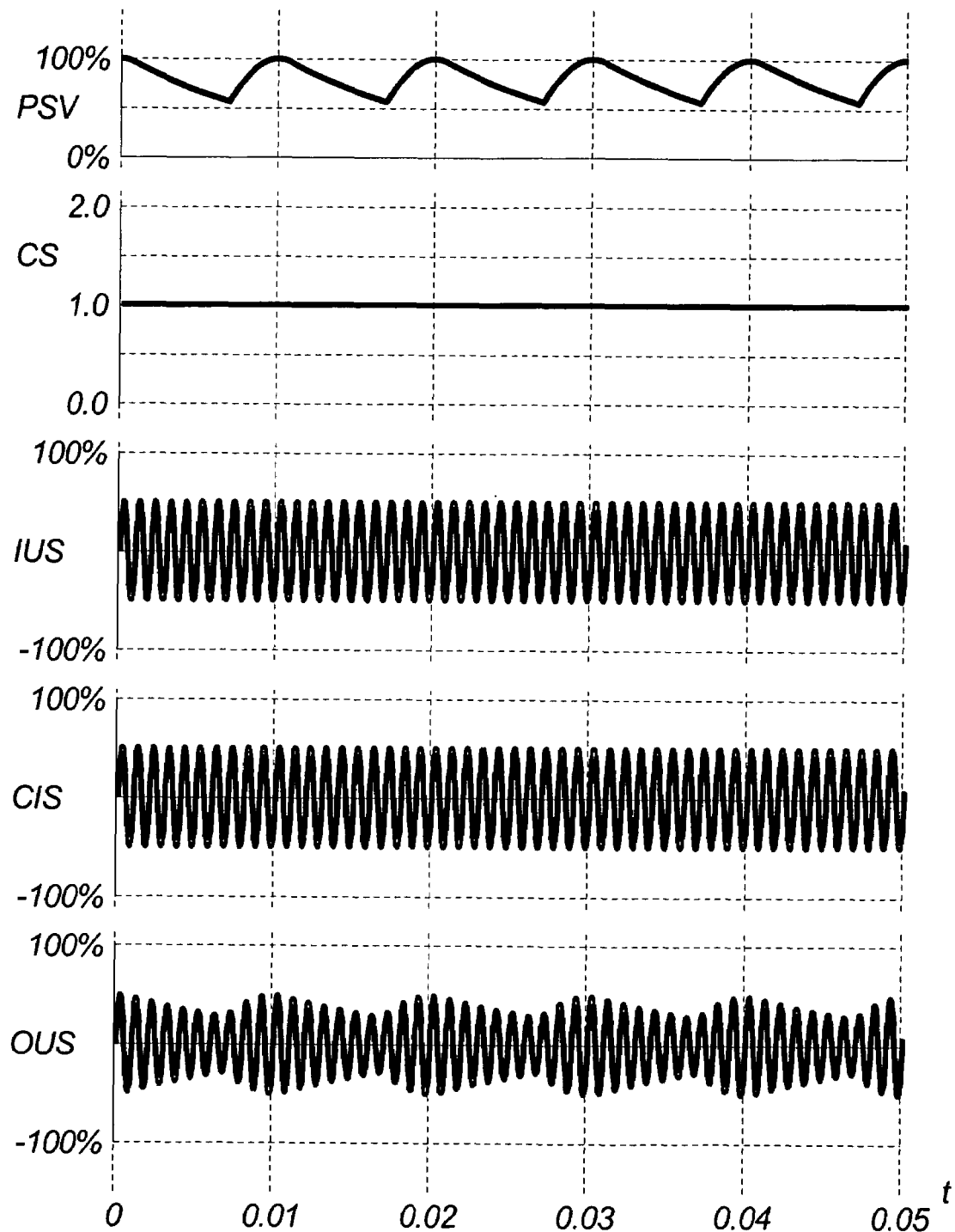
Figure 3C:
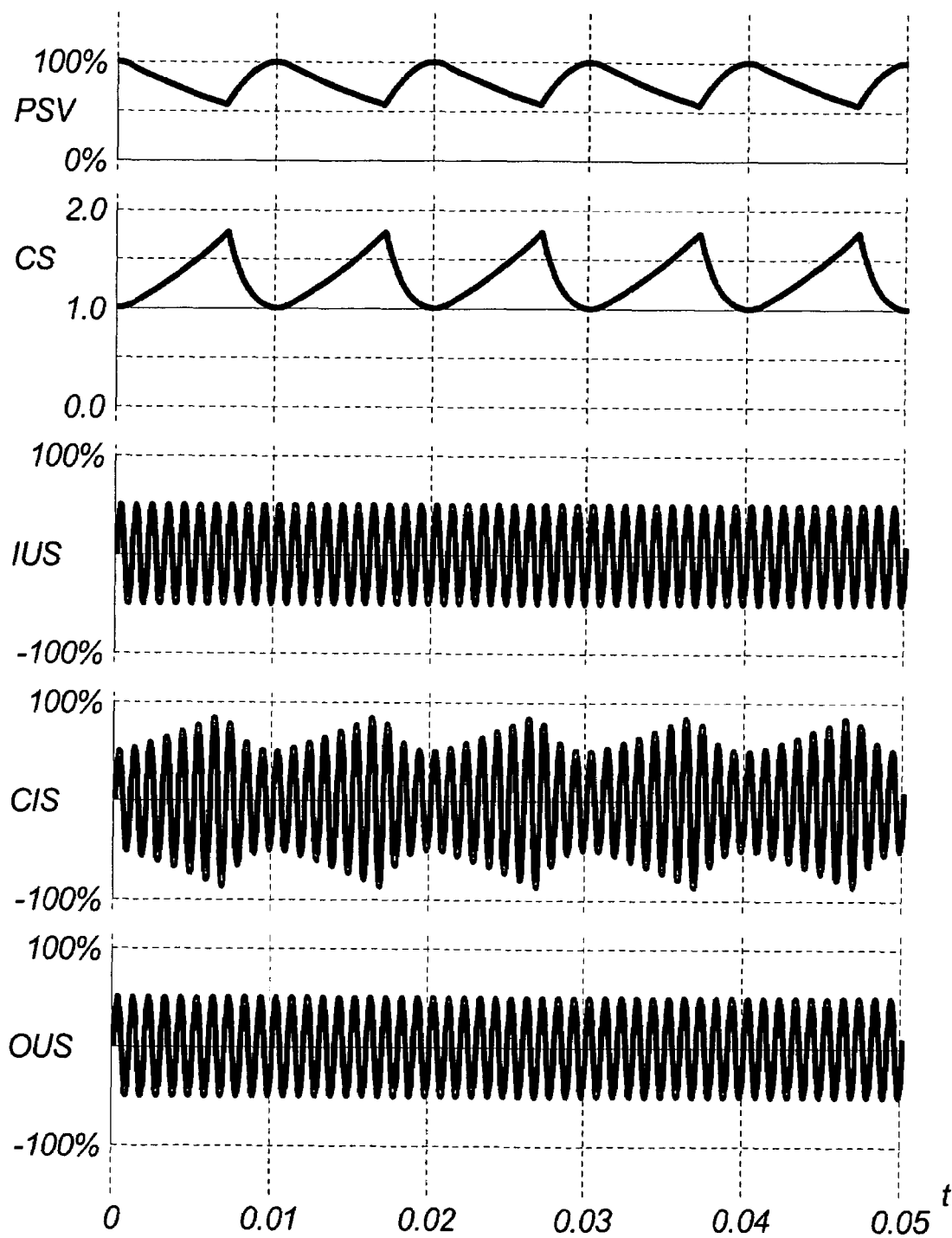

The decimation means DM of FIG. 1 may be any kind of circuitry suitable for adapting the compensation factor comprised by the output signal PWCS of the compensation means CM into matching the input utility signal IUS. The adaptation may e.g. comprise demodulation, rate conversion or decimation, conversion of encoding, amplitude scaling, biasing, or any other signal adaptation processes. An example of a decimation means according to the invention is a downsampler.

Preferred methods of implementing the decimation means DM, as well as several embodiments, are disclosed by the yet unpublished patent application PCT/DK2004/000140, hereby incorporated by reference.

As the compensation means CM output PWCS preferably is a two-level PWM signal sampled at a rate of e.g. 196.6 MHz, and the input utility signal IUS preferably is an audio signal having a resolution of e.g. 24 bits and a sample rate of e.g. 48 kHz, a preferred decimation means DM may comprise an anti-aliasing filter of the finite impulse response type (a FIR filter), combined with logics for decimating the number of output samples. An example of such is a low-pass filter operating on a relatively high rate, preferably the sample rate of the compensation means output PWCS, e.g. 196.6 MHz, followed by a sample-skip logics which, e.g., skips all but one sample every 128 samples, thereby causing the rate of the decimation means output signal to be, e.g., 1.536 MHz. The FIR filter, which preferably is a low-pass filter, serves at least three purposes. It rejects quantization noise originating from the quantization means QM within the compensation means CM, that have frequencies at which noise is not rejected by the compensation means loop filter LF. It also serves as anti-aliasing means, as anti-aliasing should always be performed before any sampling, and decimation may in this connection be considered a sampling process. And furthermore, it inherently provides for demodulation of the pulse width modulated compensation signal PWCS, as low-pass filtering has this effect on PWM signals. The FIR filter may preferably be established as three cascaded running average filters, preferably followed by two half-band FIR filters. Thus the decimation may be performed in three steps. The implementation of the first FIR filter comprising three cascaded running average filters causes decimation of the PWCS signal of e.g. 128 times from e.g. 196.6 MHz to e.g. 1.536 MHz, the first half-band FIR filter causes decimation of e.g. 2 times down to e.g. 768 kHz, and the second half-band FIR filter causes decimation of e.g. 2 times down to e.g. 384 kHz. This furthermore requires the input utility signal IUS to be upsampled e.g. 8 times from e.g. 48 kHz to the 384 kHz rate. This, however, preferably forms part of the PWM modulation anyhow performed on the input utility signal IUS.

The decimation means DM preferably comprises an anti-aliasing filter having an impulse response which is longer than the period of the pulse width modulated signal, preferably at least the length of two times the period of the pulse width modulated signal, and even more preferably at least the length of three times the period of the pulse width modulated signal. If the compensation means output PWCS is sampled at a rate of, e.g., 196.6 MHz, and the PWM switch frequency, i.e. the frequency of the PWM periods, is, e.g., 1.536 MHz, then the number of samples for each PWM period is 128, and the impulse response of the anti-aliasing filter of the decimation means should then be at least 128 samples, preferably at least 384 samples.

Figure 14:
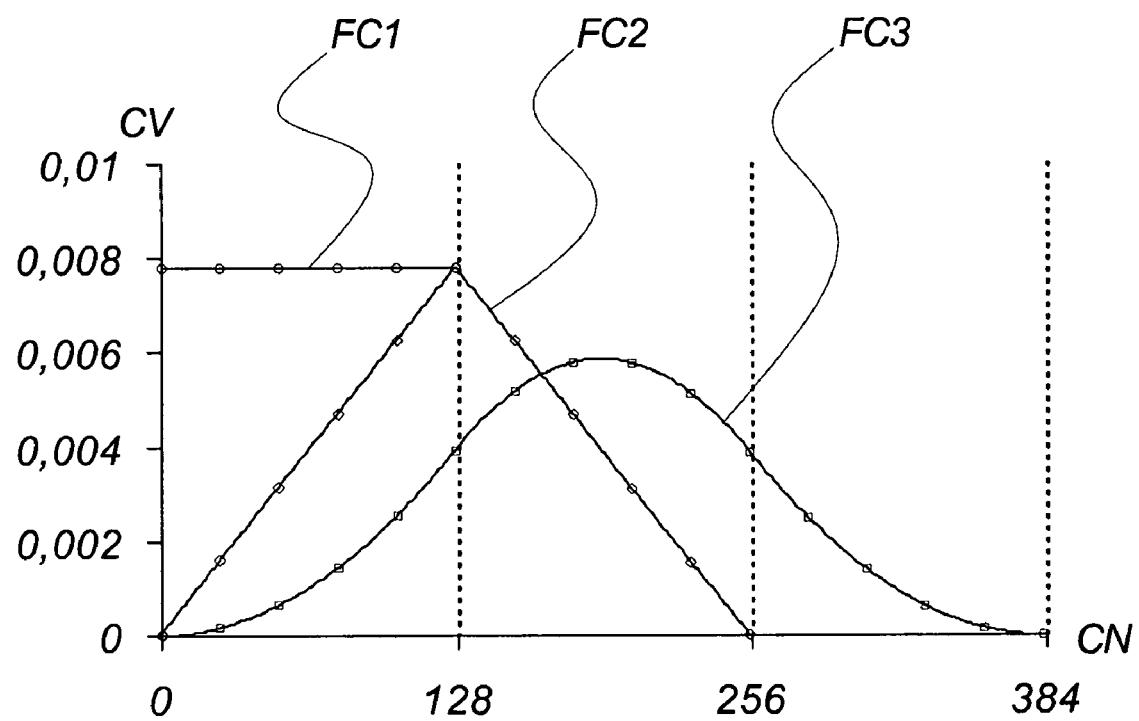

FIG. 14 illustrates three examples of filter characteristics illustrated by the filter coefficients to use as anti-aliasing filters within the decimation means DM of the present invention. It comprises a horizontal axis indicating the coefficient number CN, and a vertical axis indicating coefficient values CV. A first example of filter coefficients FC1, marked with circles, represents a 128-point running average finite impulse response (FIR) filter. All coefficients have the same value, i.e. 1/128. This filter characteristic causes a low-pass filtering of an input signal, with a DC-gain of 1.

A second example of filter coefficients FC2, marked with diamonds, represents a 256-point weighted running average FIR filter. Actually this filter corresponds to two cascaded filters with the characteristic of the above example. It causes also a low-pass filtering with a DC-gain of 1.

A third, preferred example of filter coefficients FC3, marked with squares, represents a 384-point weighted running average FIR filter. Actually this filter corresponds to three cascaded filters of the FC1 characteristic. It also causes a low-pass filtering with a DC-gain of 1.

Figure 15:
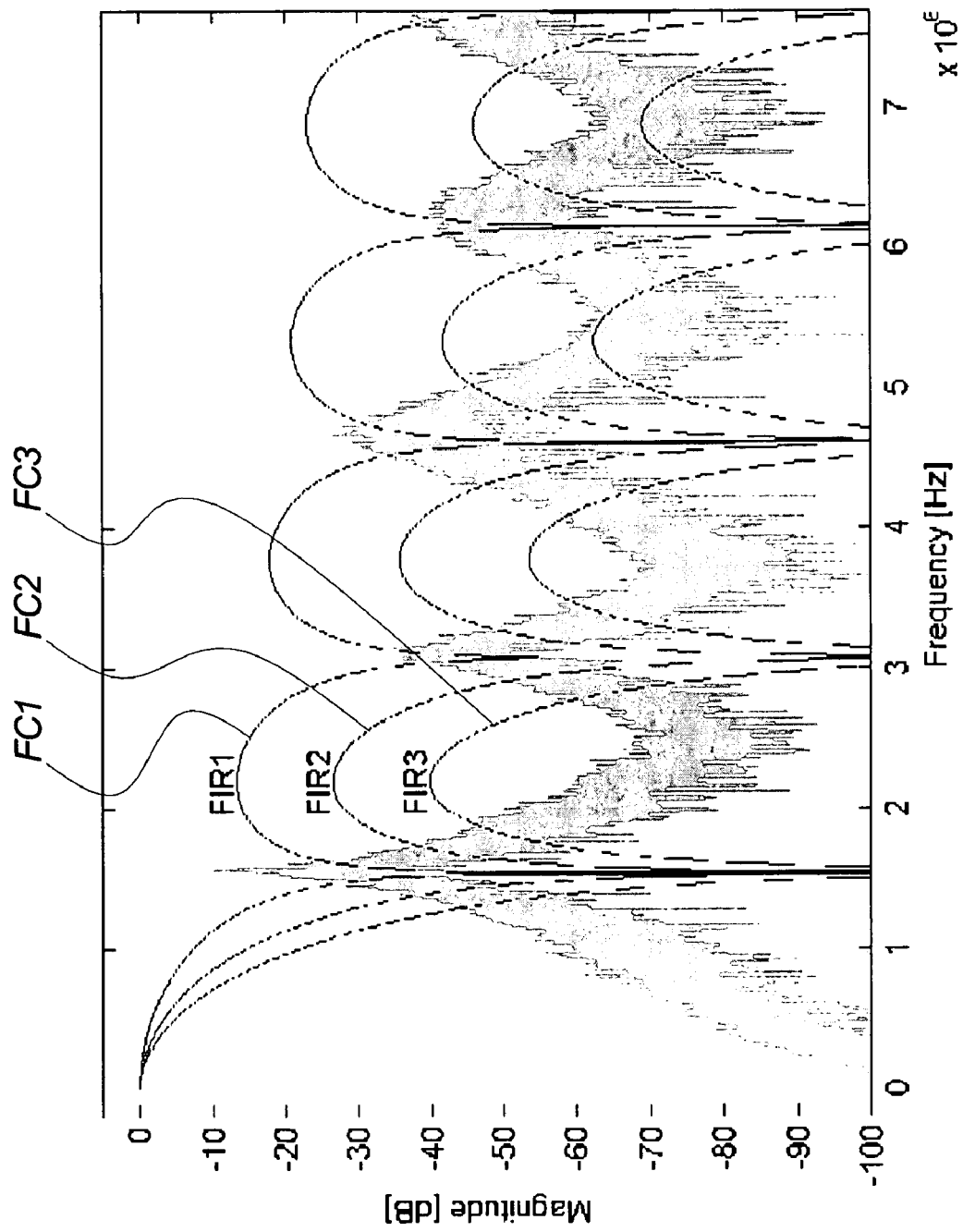

FIG. 15 illustrates the effect of the three filter examples of FIG. 14. It comprises a frequency spectrum of an example PWM signal. The signal is a two-level PWM signal. The frequency of the PWM periods is 1536 kHz, and each period is sampled with a resolution of 128 samples causing the sample rate to be 196608 kHz, i.e. 128 times 1536 kHz. From the spectrum is seen that the PWM signal has peaks at the PWM period frequency, i.e. 1536 kHz, and the harmonics of that.

Furthermore, the frequency responses of each of the filter examples of FIG. 14 are illustrated. It is clear that the performance of the third and preferred example filter is the best as it provides the best attenuation of the signal frequency peaks and still has a sufficient broad pass-band in the utility frequency range.

Designing filters for digital filtering is often a balancing between filter length and effectiveness and the intended use determines what combinations are suitable. The examples illustrated in FIG. 15 are, thus, examples of filters that are relatively short but nevertheless very effective when it comes to filtering and decimating oversampled audio signals, as they provide good attenuation in the band within 20 kHz to each side of the PWM period frequency and its harmonics, thus reducing alias errors in the audio band 0-20 kHz.

The stopband attenuation of the anti-aliasing filter illustrated in FIGS. 14 and 15 must generally be greater than 60 dB, preferably greater than 100 dB. The stopband for this type of anti-aliasing filter equals:

$$\text{Stopband}=k \cdot f_{Sout} \pm BW,$$

where k=1, 2, 3, . . . until the Nyquist frequency is reached, $f_{Sout}$ is the output rate of the decimation means DM and BW is the utility bandwidth, e.g. 20 kHz.

The extrapolation means EM of FIG. 1 may be any kind of means for extrapolating the compensation factor, or predicting future compensation factors. As the compensation factor established and processed by the compensation means CM and decimation means DM actually corresponds to the compensation required some time ago due to delays in e.g. the compensation and decimation means, an extrapolation or prediction of the compensation factor is preferably performed prior to multiplying the input signal with the compensation factor.

What extrapolation or prediction method to provide by the extrapolation means EM in a particular implementation of the present invention depends on the delays of the compensation and decimation means of that particular implementation and on the nature of the changes of the power supply voltage, i.e. frequency, amount, etc. A preferred extrapolation means EM comprises modelling the compensation signal by a polynomial on the basis of a sequence of previous compensation factors, and extrapolating future compensation factors from that model. The polynomial is preferably a second or third order polynomial, established on the basis of the previous 3 or 4 compensation factor samples. The delay to be compensated for by the extrapolation means may typically correspond to 2 to 10 samples of the input utility signal, e.g. 6 samples of a signal with a rate of 384 kHz. When the delay corresponds to e.g. 6 samples, and the extrapolation means e.g. models the compensation signal by a second order polynomial y(n) on the basis of the compensation factors x(n−2), x(n−1) and x(n), it should output y(n+6) as the next compensation signal sample.

Simulations show that using second or third order polynomials for compensating delays corresponding to e.g. 6, 8 and 10 samples of the input utility signal, when the frequency of the power supply voltage changes, e.g. ripple, is less than 10 kHz, increases the effect of providing compensation means CM for compensating for an unstable power supply.

It is noted that in order to establish a beneficial extrapolation algorithm, certain knowledge about the behavior of the error-inducing signal, i.e. the variations in the power supply voltage, may be required.

Figure 17:
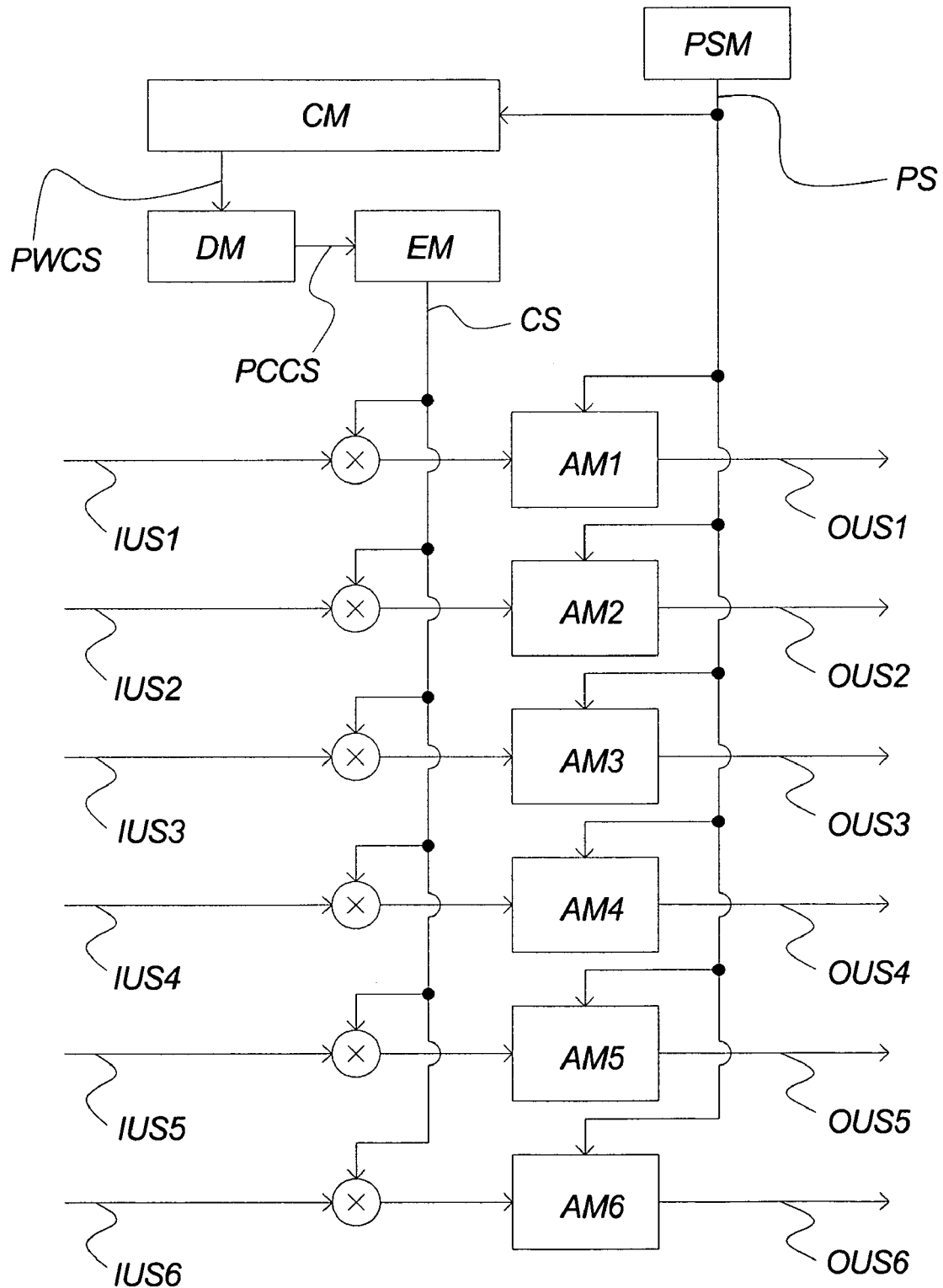

FIG. 17 illustrates a conceptual overview of an embodiment of the present invention. It corresponds to FIG. 1, but in FIG. 17 the input utility signal IUS is a multi-channel signal comprising six channels, IUS1 . . . IUS6. This may, e.g., be a Dolby Digital 5.1 surround sound audio signal. The embodiment of FIG. 17 further comprises six channel amplification means AM1 . . . AM6 and six output channels OUS1 . . . OUS6.

The individual channels of the multi-channel system may be received by a single input as a multi-channel encoded digital signal and subsequently decoded in order to establish discrete signals for amplification, or they may be received as discrete channels immediately ready for amplification. It is noted that any single- or multi-channel encoding and distribution scheme and combination thereof is within the scope of the present invention, as are also any possible distribution, mapping and/or mixing of input channels to the available channel amplification means and output channels, e.g. any down-mixing of surround signals for amplification by a stereo- or 2.1-amplifier. Also any bundling or encoding of the output signals is within the scope of the present invention.

FIG. 17 further comprises a power supply means PSM, a power signal PS, a compensation means CM, a decimation means DM and an extrapolation means EM, all corresponding to the embodiments and variations described above.

As the compensation signal CS is in a preferred embodiment substantially independent from anything else than the power supply voltage, and in particular independent from the channel amplification means, it may be used for compensating any signal that is bound for processing having a multiplicative relationship with the power supply voltage PS, anywhere in the entire system. Such a relationship may be established in, e.g., switch-mode amplifiers.

The individual channel amplification means AM1 ... AM6 are preferably of substantially equal specifications, especially regarding, e.g., efficiency, power dissipation, noise and error contribution, etc., in order for equal input signals to cause equal output signals on different channels. This is however not the most important requirement for all channels in all possible applications of the present invention, and under such circumstances one or more channel amplification means may differ from the others in order to serve specific purposes or be optimized regarding certain parameters. An example of an application where different channel amplification means may be relevant is in a surround amplifier where more power may be desired for the subwoofer channel than for the full-frequency channels. In such an application the full-frequency amplification means may, e.g., be driven by a positive power supply only, whereas the subwoofer amplification means may be driven by both a positive and a negative power supply. In such an application there may be a power supply compensation circuit for each physical power supply, providing compensation signals for the relevant utility signals.

In order to achieve optimum and equal power supply compensation for all channels, the path of the power supply signal PS for each individual channel amplification means should not comprise any significant series resistance between the point where the compensation means senses the power signal voltage and the point where the path splits up for the individual channel amplification means, i.e. the channel amplification means should not share any series resistance subsequently to the sensing point. This would cause the individual channel amplification means to disturb each other without the compensation means sensing it. Hence, the channel amplification means should be supplied by means of a star topology having the compensation means sensing point located in the center of the star. Moreover any electrical resistance or other parameters should preferably be substantially equal for each individual channel amplification means supply path. These preferences may possibly be met by implementing all channel amplification means on a single chip with individual pins for power supply, or alternatively implement the power signal sensing on-chip, and providing a pin to be connected with the compensation means. Obviously the compensation means may as far as practically possible also be implemented on the same or a different chip.

Figure 18:
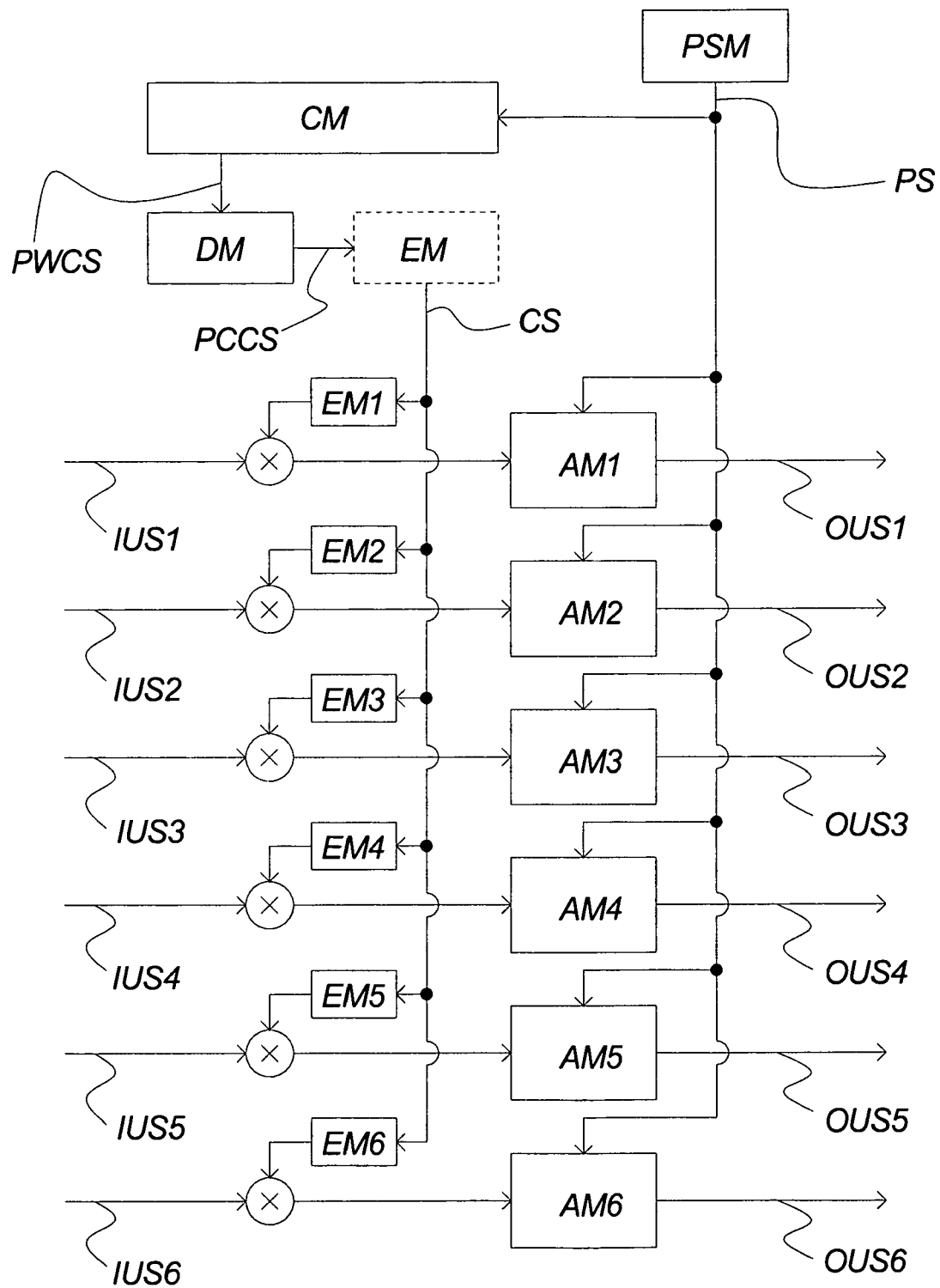

FIG. 18 corresponds to FIG. 17 except for each channel having its own extrapolation means EM1 ... EM6. A common extrapolation means EM may however also be provided as illustrated by the dashed rectangle.

Individual extrapolation means may be necessary in applications where the delay is different or may be different under certain circumstances for the individual channels. An example of an application making use of different and/or varying delays is a PWM amplifier exploiting the technology disclosed in the yet unpublished PCT patent application PCT/DK2004/000376 for avoiding pulses that are too narrow compared to the slew rate provided by the switching means and thereby establishing distorted pulses. This implies certain manipulations of the signal, causing the channel delay to vary in correspondence to the nature of the utility signal. The technology disclosed in the above-mentioned application may also be used for avoiding the switches of two or more channels to operate simultaneously, thereby possibly disturbing each other, and this may also cause variations of the delays of the individual channels. As the extrapolation means are provided for attempting to synchronize the compensation signal to the power supply voltage at the moment of switching, various delays in the individual channels requires different extrapolation means for each channel, i.e. variations in the channel delay causes the look-ahead time assumed by the extrapolation means to vary.

The invention claimed is:

1. An amplifier comprising amplification means comprising an input and an output,
    said amplification means comprising a switching output stage delivering at least one output signal via said output,
    said amplification means being fed by power supply means,
    said amplifier flirt her comprising compensation means providing a compensation signal derived from the power supply voltage of the power supply means,
    said compensation signal comprising a substantially inverse representation of said power supply voltage and
    said compensation signal being fed to said amplification means via at least one multiplication point in which the compensation signal is multiplied with an input signal received from said input.

2. An amplifier according to claim 1, wherein said substantially inverse representation of the power supply voltage is scaled by a ratio substantially corresponding to a desired amplification between the output and the input of the amplification means.

3. An amplifier according to claim 1, wherein said compensation signal is established for maintaining a substantially fixed utility area of a period of the amplified pulse width modulated signal regardless of changes in the power supply voltage, wherein the fixed utility area means the area bounded by a graphical representation of a pulse of an output signal from said switching output stage, and wherein maintaining a substantially fixed utility area means that the utility areas that represent equal values of said input signal are maintained equal by means of the compensation signal regardless of changes in the power supply voltage.

4. An amplifier according to claim 1, wherein said amplifier further comprises extrapolation means adapted for modifying said compensation signal according to a predefined extrapolation algorithm.

5. An amplifier according to claim 1, wherein said compensation signal is established on the basis of an inverting generator fed by a power supply comprising a circuit adapted for establishing an inverse signal of a voltage of said power supply, said inverting generator being comprised by said compensation means.

6. An amplifier according to claim 5, wherein said inverting generator comprises at least one feedback loop having a power supply voltage dependent feedback.

7. An amplifier according to claim 5, wherein said inverting generator comprises
    at least one forward path having an input and an output,
    at least one reference oscillator, and
    at least one feedback path derived from said forward path and fed back to said input of said forward path by means of a summing point subtracting the feed-back signal from an input received from said reference oscillator,
    wherein said feedback path comprises a power supply voltage dependent feedback.

8. An amplifier according to claim 7, wherein said inverting generator outputs a digital signal on an output of said forward path derived from at least one analog signal received in an input.

9. An amplifier according to claim 7, wherein said forward path comprises a limiter adapted for providing a pulse width modulated output signal of said forward path.

10. An amplifier according to claims 9, wherein said forward path further comprises a time quantizer converting said pulse width modulated signal, preferably two-level, into a time discrete signal fed to the output of said forward path.

11. An amplifier according to claim 1, wherein said input signal is a digital input signal.

12. An amplifier according to claim 1, wherein said amplifier further comprises decimation means adapted for transforming said compensation signal into compatibility with said input signal.

13. An amplifier according to claim 1, wherein signal processing performed by said amplification means multiplicatively depends on the power supply voltage.

14. An amplifier according to claim 7, wherein said inverting generator comprises at least one self-oscillating loop.

15. An amplifier according to claim 14, wherein said self-oscillating loop comprises said at least one forward path and said at least one feedback path.

16. An amplifier according to claim 7, wherein said forward path comprises at least one loop filter.

17. An amplifier according to claim 16, wherein said at least one loop filter is adapted to facilitate self-oscillation.

18. An amplifier according to claim 14, wherein a switch frequency of a pulse width modulated output signal provided by a limiter is at least partly defined by said at least one self-oscillating loop.

19. An amplifier according to claim 16, wherein an order of said at least one loop filter is at least first order.

20. An amplifier according to claim 16, wherein an order of said at least one loop filter is at least second order.

21. An amplifier according to claim 5, wherein an effective order of an open loop transfer function of said inverting generator is at least one, preferably substantially two, wherein the effective order means a filter order apparent from the slope of a logarithmic frequency response gain plot of said open loop transfer function; said effective order preferably being derived by dividing a gradient of said plot by a gradient of a first-order transfer function.

22. An amplifier according to claim 14, wherein a phase margin of the open loop characteristic of said self-oscillating loop for frequencies within a frequency band starting from an upper limit of a utility frequency band and ending at the switch frequency is between 0° and 60°, more preferably between 0° and 45°, and even more preferably between 0° and 30°.

23. An amplifier according to claim 5, wherein said inverting generator comprises switch frequency control means.

24. An amplifier according to claim 23, wherein said switch frequency control means comprises an oscillating overlay signal generator connected to said at least one self-oscillating loop.

25. An amplifier according to claim 7, wherein said reference oscillator provides a composite reference signal comprising a DC reference value and an oscillating overlay signal.

26. An amplifier according to claim 25, wherein said oscillating overlay signal comprises a peak-to-peak amplitude of less than 10% of said DC reference value, preferably less than 5% of said DC reference value.

27. An amplifier according to claim 10, wherein a clock frequency of said time quantizer is at least ten times greater than a switch frequency of said pulse width modulated output signal provided by said limiter, preferably at least hundred times greater.

28. An amplifier according to claim 12, wherein said decimation means comprises an anti-aliasing filter having an impulse response which is longer than a period of a pulse width modulated output signal established by a limiter and a time quantizer comprised by said compensation means, preferably at least the length of two times the period of said pulse width modulated output signal, and even more preferably at least the length of three times the period of said pulse width modulated output signal.

29. An amplifier according to claim 28, wherein a stopband attenuation of said anti-aliasing filter of said decimation means is greater than 50 dB, preferably greater than 70 dB.

30. An amplifier according to claim 28, wherein said anti-aliasing filter of said decimation means comprises stopbands defined by:

$$\text{Stopband} = k \cdot f_{Sout} \pm BW,$$

where $k = 1, 2, 3, \ldots$ until the Nyquist frequency is reached, $f_{Sout}$ is the output rate of the decimation means and BW is the utility bandwidth, e.g. 20 kHz.

31. An amplifier according to any of the claims 28, wherein said anti-aliasing filter of said decimation means comprises at least two, preferably three, cascaded running average FIR filters.

32. An amplifier according claim 31, wherein said anti-aliasing filter of said decimation means further comprises two half-band FIR filters.

33. An amplifier according to claim 6, wherein said power supply voltage dependent feedback comprises buffering means.

34. An amplifier according to claim 33, wherein said buffering means comprises certain specifications substantially representing corresponding specifications of said amplification means.

35. An amplifier according to claim 5, wherein said inverting generator is adapted for establishing at least one reciprocated electrical signal, said inverting generator comprising at least one feedback loop, said at least one feedback loop comprising at least one forward path being fed by a reference signal and comprising at least one non-linearity, and at least one feedback path comprising at least one variable amplifier, wherein at least one of said at least one variable amplifier is controlled on the basis of an electrical signal.

36. An amplifier according to claim 35, wherein at least one of said at least one feedback loop of said inverting generator comprises at least one quantization means.

37. An amplifier according to claim 35, wherein at least one of said at least one feedback loop of said inverting generator comprises at least one digital-to-analog conversion means.

38. An amplifier according to claim 35, wherein at least one of said at least one feedback loop of said inverting generator comprises at least one loop filter.

39. An amplifier according to claim 5, wherein at least one forward path of said inverting generator comprises at least one analog-to-digital converter, preferably comprising at least one latch, and at least one of said at least one feedback path of said inverting generator comprises at least one digital-to-analog converter.

40. An amplifier according to claim 1, wherein said input receives at least one input signal.

41. An amplifier according to claim 1, wherein said input receives a composite signal, said composite signal comprises at least two input signals.

42. An amplifier according to claim 41, wherein said composite signal comprises two input signals, six signals, or eight signals.

43. An amplifier according to claim 40, wherein said amplification means comprises at least one channel amplification means.

44. An amplifier according to claim 1, wherein said amplification means comprises two, five, six, seven or eight channel amplification means.

45. An amplifier according to claim 1, wherein said amplification means delivers one output signal, two output signals, five output signals, six output signals, or eight output signals via said output.

46. An amplifier according to claim 43, wherein said compensation signal is fed to at least one of said at least one channel amplification means by multiplication with the corresponding said at least one input signal.

47. An amplifier according to claim 4, wherein said extrapolation means comprises distributed extrapolation means.

48. An amplifier according to claim 4, wherein said amplification means comprises at least one channel amplification means and said extrapolation means comprises distributed extrapolation means, wherein said compensation signal is fed to at least one of said at least one channel amplification means by extrapolation by the corresponding said distributed extrapolation means and said multiplication with the corresponding said at least one input signal.

49. Method for compensating errors of a power signal comprising a power supply voltage, comprising
- performing multiplicatively power supply voltage dependent signal processing on an input utility signal by means of amplification means,
- establishing a compensation signal comprising a representation of the ratio between a desired voltage and said power supply voltage, and
- applying said compensation signal to said input utility signal by means of multiplication.

50. Method for compensating errors of a power signal according to claim 49, whereby said establishment of a compensation signal comprises
- establishing a forward path fed by a reference signal,
- establishing a negative feedback path from the output of said forward path, and
- scaling the signal of said feedback path proportionally with a representation of said power supply voltage.

51. Method for compensating errors of a power signal according to claim 49, whereby said establishment of the compensation signal comprises
- providing an electrical signal,
- providing at least one feedback loop comprising
  - at least one forward path comprising at least one non-linearity and
  - at least one feedback path comprising at least one variable amplifier, and
- feeding to at least one of said at least one variable amplifier said electrical signal.

52. Method for compensating errors of a power signal according to claim 51, whereby at least one of said at least one forward path is fed with at least one reference signal.

53. Method for compensating errors of a power signal according to claim 51, whereby at least one of said at least one feedback loop comprises at least one quantization means.

54. Method for compensating errors of a power signal according to claim 51, whereby at least one of said at least one feedback loop comprises at least one digital-to-analog conversion means.

55. Method for compensating errors of a power signal according to claim 53, whereby quantization noise introduced by at least one of said at least one quantization means is shaped by at least one loop filter.

56. Method for compensating errors of a power signal according to claim 52, whereby said reference signal is an oscillating voltage signal.

57. Method for compensating errors of a power signal according to claim 51, whereby said non-linearity is a limiter.

58. Method for compensating errors of a power signal according to claim 51, whereby said non-linearity is a comparator.

* * * * *